(12) United States Patent
Choi et al.

(10) Patent No.: US 10,553,663 B2
(45) Date of Patent: Feb. 4, 2020

(54) DISPLAY DEVICE

(71) Applicant: Samsung Display Co., Ltd., Yongin-si, Gyeonggi-do (KR)

(72) Inventors: Jun Won Choi, Yongin-si (KR); Jun Yong An, Yongin-si (KR); Yun Kyeong In, Yongin-si (KR); Won Mi Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 135 days.

(21) Appl. No.: 15/832,586

(22) Filed: Dec. 5, 2017

(65) Prior Publication Data

US 2018/0190750 A1 Jul. 5, 2018

(30) Foreign Application Priority Data

Jan. 4, 2017 (KR) .......................... 10-2017-0001511

(51) Int. Cl.
*H01L 27/32* (2006.01)
*G09G 3/3275* (2016.01)
*H01L 27/12* (2006.01)

(52) U.S. Cl.
CPC ....... *H01L 27/3276* (2013.01); *G09G 3/3275* (2013.01); *H01L 27/3258* (2013.01); *H01L 27/3262* (2013.01); *G09G 2300/0439* (2013.01); *G09G 2300/0809* (2013.01); *G09G 2310/0297* (2013.01); *G09G 2310/08* (2013.01); *G09G 2320/02* (2013.01); *H01L 27/1222* (2013.01)

(58) Field of Classification Search
USPC ........................................................ 345/213
See application file for complete search history.

(56) References Cited

U.S. PATENT DOCUMENTS 8,730,132 B2 5/2014 Choi et al.
2006/0145606 A1 7/2006 Lee
(Continued)

FOREIGN PATENT DOCUMENTS

KR 10-0666646 B1 1/2007

OTHER PUBLICATIONS

EPO Extended Search Report dated May 25, 2018, for corresponding European Patent Application No. 18150252.7 (10 pages).

*Primary Examiner* — Chineyere D Wills-Burns
(74) *Attorney, Agent, or Firm* — Lewis Roca Rothgerber Christie LLP

(57) ABSTRACT

A display device includes: pixel columns including pixels arranged along a first direction; pixel rows including pixels arranged along a second direction crossing the first direction; data lines connected to respective pixel columns, each of the data lines including a first sub-data line provided at one side of a corresponding pixel column and a second sub-data line provided at another side of the corresponding pixel column; scan lines extending along the second direction and connected to respective pixel rows; and a power line to supply driving power to the pixels, one of the pixels of the pixel columns is connected to the first sub-data line, and a pixel adjacent to the pixel connected to the first sub-data line is connected to the second sub-data line, and the first sub-data line and the second sub-data line in the same pixel column are on different layers from each other.

23 Claims, 14 Drawing Sheets

(56) References Cited

U.S. PATENT DOCUMENTS

| | | | |
|---|---|---|---|
| 2006/0267913 A1* | 11/2006 | Mochizuki | G09G 3/3688 345/100 |
| 2007/0008263 A1* | 1/2007 | Kim | G02F 1/134336 345/87 |
| 2007/0057877 A1* | 3/2007 | Choi | G09G 3/3233 345/76 |
| 2011/0073868 A1 | 3/2011 | Nakagawa et al. | |
| 2011/0215993 A1* | 9/2011 | Cho | G09G 3/36 345/87 |
| 2015/0009108 A1* | 1/2015 | Song | G09G 3/3225 345/80 |
| 2015/0015468 A1* | 1/2015 | Ko | G09G 3/3233 345/82 |
| 2016/0141346 A1 | 5/2016 | You | |
| 2016/0155387 A1* | 6/2016 | Kim | G09G 3/3291 345/76 |
| 2016/0172377 A1 | 6/2016 | Okita | |
| 2016/0187752 A1* | 6/2016 | Zhang | G02F 1/136286 349/106 |
| 2016/0210896 A1* | 7/2016 | Gil | G09G 3/3233 |
| 2016/0349548 A1* | 12/2016 | Xu | H01L 27/124 |
| 2017/0221979 A1* | 8/2017 | Chae | H01L 27/3262 |

* cited by examiner

DISPLAY DEVICE

CROSS-REFERENCE TO RELATED APPLICATION

This application claims priority to and the benefit of Korean Patent Application No. 10-2017-0001511, filed on Jan. 4, 2017, in the Korean Intellectual Property Office, the entire disclosure of which is incorporated by reference herein.

BACKGROUND

1. Field

One or more aspects of example embodiments of the present disclosure relate to a display device.

2. Description of the Related Art

Among various display devices, an organic light emitting display device includes an anode electrode, a cathode electrode, and an organic emitting layer located between the anode electrode and the cathode electrode. In the organic light emitting display device, holes injected from the anode electrode and electrons injected from the cathode electrode are combined in the organic emitting layer so as to form excitons, and the excitons emit light through energy emission.

The organic light emitting display device includes a plurality of pixels, each including an organic light emitting diode that is a self-light emitting element. Lines and at least one thin film transistor connected to the lines to drive the organic light emitting diode are formed in each pixel.

The above information disclosed in this Background section is for enhancement of understanding of the background of the invention, and therefore, it may contain information that does not constitute prior art.

SUMMARY

One or more aspects of example embodiments are directed to a display device having improved display quality.

According to an aspect of the present disclosure, a display device includes: pixel rows including pixels arranged along a first direction, the pixel rows being repeatedly arranged along a second direction crossing the first direction; pixel columns including pixels arranged along the second direction, the pixel columns being repeatedly arranged along the first direction; data lines connected to respective pixel columns, each of the data lines including a first sub-data line provided at one side of a corresponding pixel column and a second sub-data line provided at another side of the corresponding pixel column; scan lines extending along the first direction, the scan lines being connected to respective pixel rows; and a power line configured to supply driving power to the pixels, wherein one of the pixels of the pixel columns is connected to the first sub-data line, and a pixel adjacent to the pixel connected to the first sub-data line is connected to the second sub-data line, and wherein the first sub-data line and the second sub-data line in the same pixel column are on different layers from each other.

The power line may be provided between the first sub-data line and the second sub-data line.

Each of the pixels may include: at least one transistor; and a display element connected to the transistor, wherein the transistor may include an active pattern provided on a substrate, source and drain electrodes each connected to the active pattern, a gate electrode provided on the active pattern with a gate insulating layer interposed therebetween, and an interlayer insulating layer including first, second, and third interlayer insulating layers covering the gate electrode, the first, second, and third interlayer insulating layers being sequentially stacked, and the display element may be connected to the drain electrode.

One of the first sub-data line and the second sub-data line may be on the second interlayer insulating layer, and the other of the first sub-data line and the second sub-data line may be on the third interlayer insulating layer.

The power line may include first and second power supply lines on different layers from each other, the first and second power supply lines overlapping with each other.

One of the first power supply line and the second power supply line may be on the second interlayer insulating layer, the other of the first power supply line and the second power supply line may be on the third interlayer insulating layer, and the first power supply line and the second power supply line may be connected to each other through a contact hole.

First power supply lines of pixel columns that are adjacent to each other may be connected to each other through a first power connection line, and the first power connection line may be on the same layer as that of the first power supply lines.

The first power supply lines and the first power connection line may be on the second interlayer insulating layer.

Second power supply lines of pixel columns that are adjacent to each other may be connected to each other through a second power connection line, and the second power connection line may be on the same layer as that of the second power supply line.

The second power supply lines and the second power connection line may be on the third interlayer insulating layer.

The display may further include a storage capacitor including a lower electrode on the gate insulating layer and an upper electrode on the first interlayer insulating layer.

The display device may further include a first bridge pattern on the second interlayer insulating layer, the first bridge pattern being configured to electrically connect the drain electrode and the display element to each other.

The display device may further include a second bridge pattern on the third interlayer insulating layer, the second bridge pattern being configured to electrically connect the first bridge pattern and the display element to each other.

The display element may include a first electrode on a fourth interlayer insulating layer on the third interlayer insulating layer, an emitting layer on the first electrode, and a second electrode on the emitting layer, and the first electrode may be connected to the second bridge pattern through a contact hole passing through the fourth interlayer insulating layer.

The first sub-data line and the second sub-data line that are between two different pixel columns that are adjacent to each other may be connected to the two different pixel columns, and may be on the same layer.

Two sub-data lines that are located most distant from each other from among four sub-data lines that are connected to the two pixel columns that are adjacent to each other may be connected to pixels located on the same pixel row.

The two sub-data lines located most distant from each other may be on the same layer.

Two sub-data lines that are adjacent to each other from among the four sub-data lines that are connected to the two pixel columns that are adjacent to each other may be connected to pixels located on the same pixel row.

The two sub-data lines that are adjacent to each other may be on the same layer.

The two sub-data lines that are located most distant from each other and the two sub-data lines that are adjacent to each other may be on different layers from each other.

The display device may further include: a data driver configured to supply a data signal to the data lines through output lines; and demultiplexers connected between the output lines and the data lines.

The demultiplexers may be configured to time-divisionally transmit the data signal to the first sub-data line and the second sub-data line.

The first sub-data line and the second sub-data line that are between the two different pixel columns that are adjacent to each other may be connected to different demultiplexers from each other, and may be configured to receive a data signal input during the same period.

BRIEF DESCRIPTION OF THE DRAWINGS

Hereinafter, example embodiments will be described more fully with reference to the accompanying drawings. However, the present invention may be embodied in various different forms, and should not be construed as limited to the embodiments set forth herein. Rather, these embodiments are provided so that this disclosure will be thorough and complete, and will fully convey the scope of the example embodiments to those skilled in the art. Accordingly, processes, elements, and techniques that are not necessary to those having ordinary skill in the art for a complete understanding of the aspects and features of the present invention may not be described.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the drawings and the written description, and thus, descriptions thereof may not be repeated.

DETAILED DESCRIPTION

Figure 1:
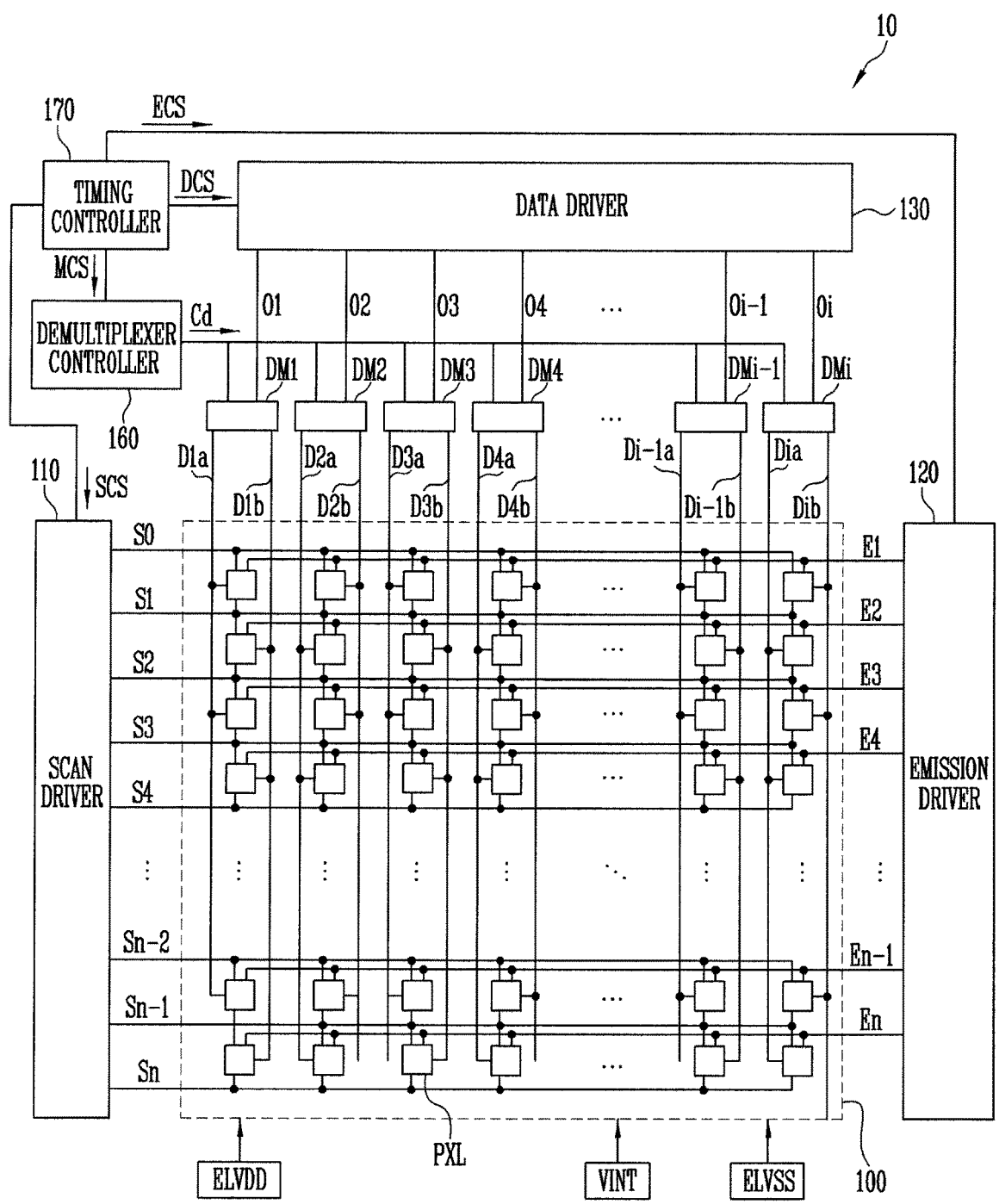
FIG. 1 is a diagram illustrating a display device according to an embodiment of the present disclosure.

The present disclosure may be applied with various changes and different shapes, and therefore, are illustrated in detail with particular examples. However, these examples are not limited to the certain shapes described herein, but may be applied to all suitable changes and with equivalent materials and replacements. The drawings included are illustrated in a fashion where the figures may be expanded for better understanding.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

FIG. 1 is a diagram illustrating a display device according to an embodiment of the present disclosure.

Referring to FIG. 1, the display device 10 may include pixels PXL, a scan driver 110, an emission driver 120, a data driver 130, demultiplexers DM1 to DMi, a demultiplexer controller 160, and a timing controller 170.

The pixels PXL may be connected to a plurality of scan lines S0 to Sn, a plurality of emission control lines E1 to En, and a plurality of data lines D1a to D1b. Accordingly, the pixels PXL may receive scan signals and emission control signals, which are respectively supplied through the scan lines S0 to Sn and the emission control lines E1 to En. Also, the pixels PXL may receive data signals supplied through the data lines D1a to D1b.

The pixels PXL may be arranged in a matrix form along a plurality of pixel rows extending in one direction, and a plurality of pixel columns extending in another direction crossing the pixel rows. That is, the pixel rows may include pixels PXL arranged in the one direction, and the pixel columns may include pixels PXL arranged in the other direction crossing the pixel rows. Meanwhile, in this embodiment, a case where the pixels PXL are arranged in a matrix form has been described as an example. However, the present disclosure is not limited thereto, and the pixels PXL may be arranged in various forms.

The pixels PXL may be connected to a first power source ELVDD, a second power source ELVSS, and a third power source VINT, and may receive power voltages provided from the power sources.

Each of the pixels PXL may control the amount of current flowing from the first power source ELVDD to the second power source ELVSS via an organic light emitting diode, corresponding to a data signal. In this case, the organic light emitting diode may generate light with a luminance corresponding to the amount of current.

The scan driver 110 may supply scan signals to the scan lines S0 to Sn, corresponding to a scan driver control signal SCS from the timing controller 170. For example, the scan driver 110 may sequentially supply scan signals to the scan lines S0 to Sn. When the scan signals are sequentially supplied to the scan lines S0 to Sn, the pixels PXL may be sequentially selected in units of the pixel rows (e.g., horizontal lines). In this case, the scan signal may have a voltage level at which a transistor supplied with the scan signal may be turned on.

The emission driver 120 may supply emission control signals to the emission control lines E1 to En, corresponding to an emission driver control signal ECS from the timing controller 170. For example, the emission driver 120 may sequentially supply the emission control signals to the emission control lines E1 to En. In this case, the emission control signal may have a voltage level at which a transistor supplied with the emission control signal may be turned on.

The data driver 130 may supply data signals to output lines O1 to Oi, corresponding to a data driver control signal DCS from the timing controller 170. That is, the data driver 130 may supply the data signals to the demultiplexers DM1 to DMi through the output lines O1 to Oi.

The demultiplexers DM1 to DMi may receive the data signals supplied from the data driver 130, and may supply the data signals to the data lines D1a to D1b. For example, the demultiplexers DM1 to DMi may receive the data signals input through the output lines O1 to Oi, and may time-divisionally output the data signals to the data lines D1a to D1b having a number greater than that of the output lines O1 to Oi. Therefore, the pixels PXL may receive the data signals supplied through the data lines D1a to D1b. For example, the number of the data lines D1a to D1b may be two times the number of the output lines O1 to Oi of the data driver 130.

In an example embodiment, a capacitor may be included on each of the data lines D1a to D1b to store signals applied to the data lines D1a to D1b. For example, the capacitors on the data lines D1a to D1b may be caused by parasitic capacitances, and/or the capacitors may be physically installed on the data lines D1a to D1b.

The demultiplexer controller 160 may control operations of the demultiplexers DM1 to DMi via (or through) a driving signal Cd. For example, the driving signal Cd may control operations of transistors included in each of the demultiplexers DM1 to DMi. The demultiplexer controller 160 may receive a demultiplexer control signal MCS supplied from the timing controller 170, and may generate the driving signal Cd corresponding to the demultiplexer control signal MCS.

In FIG. 1, the demultiplexer controller 160 is illustrated separately from the timing controller 170. However, the demultiplexer controller 160 may be integrated with the timing controller 170, if desired.

The timing controller 170 may control the scan driver 110, the emission driver 120, the data driver 130, and the demultiplexer controller 160. Accordingly, the timing controller 170 may supply the scan driver control signal SCS and the emission driver control signal ECS to the scan driver 110 and the emission driver 120, respectively.

Also, the timing controller 170 may supply the data driver control signal DCS and the demultiplexer control signal MCS to the data driver 130 and the demultiplexer controller 160, respectively.

For convenience of description, the scan driver 110, the emission driver 120, the data driver 130, the demultiplexer controller 160, and the timing controller 170 are individually illustrated in FIG. 1, but at least some of these components may be integrated together.

The first power source ELVDD, the second power source ELVSS, and the third power source VINT may provide power voltages to the pixels PXL located in a pixel area 100. For example, the first power source ELVDD may be a high-potential power source, and the second power source ELVSS may be a low-potential power source. As an example, the first power source ELVDD may be set to a positive voltage, and the second power source ELVSS may be set to a negative voltage or to ground. In addition, the third power source VINT may be set to a voltage lower than that of the data signal.

In FIG. 1, the pixel rows may be connected to the scan lines S0 to Sn, respectively, and the pixel columns may be connected to the output lines O1 to Oi, respectively.

Figure 2:
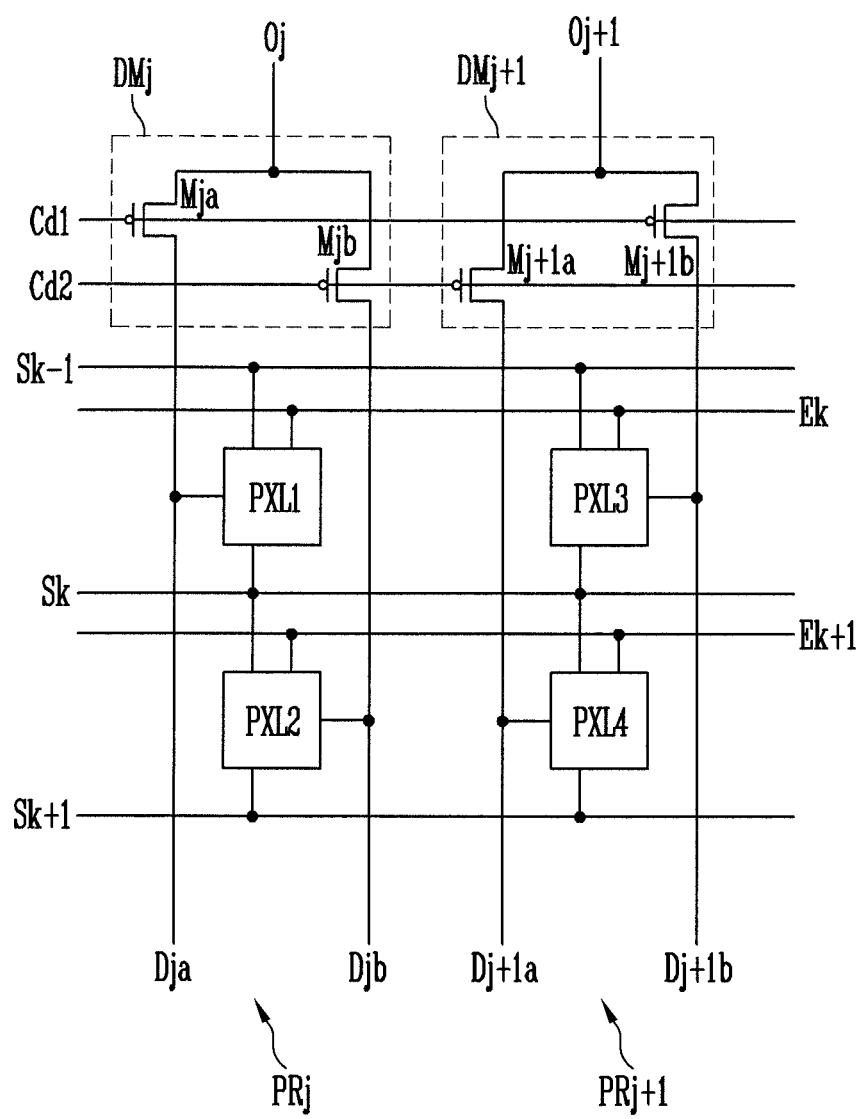
FIG. 2 is a diagram illustrating a demultiplexer in more detail, according to an embodiment of the present disclosure.

FIG. 2 is a diagram illustrating a demultiplexer in more detail, according to an embodiment of the present disclosure. For convenience of description, a jth (j is a natural number) demultiplexer DMj, a (j+1)th demultiplexer DMj+1, a jth pixel column PRj, and a (j+1)th pixel column (PRj+1), which are connected to a jth output line Oj and a (j+1)th output line Oj+1 that transmit data signals output from the data driver of FIG. 1, are mainly illustrated in FIG. 2.

Referring to FIGS. 1 and 2, the jth demultiplexer DMj may be connected between the jth output line Oj and jth data lines Dja and Djb. The jth data lines Dja and Djb may include a first-sub-data line Dja and a second sub-data line Djb.

The jth demultiplexer DMj may time-divisionally transmit a data signal that is output from the data driver 130 and transmitted through the jth output line Oj to the first sub-data line Dja and the second sub-data line Djb. In addition, the first sub-data line Dja and the second sub-data line Djb may be connected to pixels PXL constituting one pixel column (e.g., the pixel column PRj).

The first sub-data line Dja may be connected to some of the pixels PXL constituting the one pixel column PRj, and the second sub-data line Djb may be connected to the others of the pixels PXL constituting the one pixel column PRj. For example, the pixels PXL constituting the one pixel column PRj may include first pixels PXL1 and second pixels PXL2, which are alternately disposed. Here, the first pixels PXL1 may be connected to the first sub-data line Dja, and the second pixels PXL2 may be connected to the second sub-data line Djb.

The first pixels PXL1 and the second pixels PXL2 may emit light of different colors. For example, the first pixels PXL1 may emit red light, and the second pixels PXL2 may emit blue light.

The jth demultiplexer DMj may include a first transistor Mja and a second transistor Mjb, which are used to transmit the data signal.

The first transistor Mja may be connected between the jth output line Oj and the first sub-data line Dja, and an on-off operation of the first transistor Mja may be controlled by a first driving signal Cd1. The second transistor Mjb may be connected between the jth output line Oj and the second sub-data line Djb, and an on-off operation of the second transistor Mjb may be controlled by a second driving signal Cd2.

For example, when the first driving signal Cd1 is supplied, the first transistor Mja may be turned on, and accordingly, the data signal of the jth output line Oj may be supplied to the first sub-data line Dja. In addition, when the second driving signal Cd2 is supplied, the second transistor Mjb may be turned on, and accordingly, the data signal of the jth output line Oj may be supplied to the second sub-data line Djb.

The first transistor Mja and the second transistor Mjb may be turned on during periods different from each other. To this end, the supply period of the first driving signal Cd1 and the supply period of the second driving signal Cd2 may not overlap with each other.

The (j+1)th demultiplexer DMj+1 may be connected between the (j+1)th output line Oj+1 and (j+1)th data lines Dj+1a and Dj+1b.

The (j+1)th data lines Dj+1a and Dj+1b may include a first sub-data line Dj+1a and a second sub-data line Dj+1b.

The (j+1)th demultiplexer DMj+1 may time-divisionally transmit a data signal transmitted through the (j+1)th output line Oj+1 to the first sub-data line Dj+1a and the second sub-data line Dj+1b. In addition, the first sub-data line Dj+1a and the second sub-data line Dj+1b may be connected to pixels PXL constituting one pixel column (e.g., the pixel column PRj+1).

The first sub-data line Dj+1a may be connected to some of the pixels PXL constituting the one pixel column PRj+1, and the second sub-data line Dj+1b may be connected to the others of the pixels PXL constituting the one pixel column PRj+1. For example, the pixels PXL constituting the one pixel column PRj+1 may include third pixels PXL3 and fourth pixels PXL4, which are alternately disposed. Here, the third pixels PXL3 may be connected to the second sub-data line Dj+1b, and the fourth pixels PXL4 may be connected to the first sub-data line Dj+1a.

The third pixels PXL3 and the fourth pixels PXL4 may emit light of the same color, which may be different from those of the first pixels PXL1 and the second pixels PXL2. For example, the third pixels PXL3 and the fourth pixels PXL4 may each emit green light.

The (j+1)th demultiplexer DMj+1 may include a first transistor Mj+1a and a second transistor Mj+1b.

The first transistor Mj+1a may be connected between the (j+1)th output line Oj+1 and the first sub-data line Dj+1a, and an on-off operation of the first transistor Mj+1a may be controlled by the second driving signal Cd2. The second transistor Mj+1b may be connected between the (j+1)th output line Oj+1 and the second sub-data line Dj+1b, and an on-off operation of the second transistor Mj+1b may be controlled by the first driving signal Cd1.

For example, when the first driving signal Cd1 is supplied, the second transistor Mj+1b may be turned on, and accordingly, the data signal of the (j+1)th output line Oj+1 may be supplied to the second sub-data line Dj+1b. In addition, when the second driving signal Cd2 is supplied, the first transistor Mj+1a may be turned on, and accordingly, the data signal of the (j+1)th output line Oj+1 may be supplied to the first sub-data line Dj+1a.

The first transistor Mj+1a and the second transistor Mj+1b may be turned on during periods different from each other. To this end, the supply period of the first driving signal Cd1 and the supply period of the second driving signal Cd2 may not overlap with each other.

In whole, two data lines Djb and Dj+1a that are adjacent to each other from among the four data lines Dja, Djb, Dj+1a, and Dj+1b, and located in two adjacent pixel columns PRj and PRj+1, respectively, may be connected to the second and fourth pixels PXL2 and PXL4 located on the same horizontal line (or pixel row).

Two data lines located most distant from each other from among the four data lines Dja, Djb, Dj+1a, and Dj+1b, and located in the two adjacent pixel columns PRj and PRj+1, respectively, may be connected to the first and third pixels PXL1 and PXL3 located on the same horizontal line.

The two data lines Djb and Dj+1a that are adjacent to each other from among the four data lines Dja, Djb, Dj+1a, and Dj+1b, and located in the two adjacent pixel columns PRj and PRj+1, respectively, may receive a data signal that is input during the same period. To this end, the second transistor Mjb of the jth demultiplexer DMj and the first transistor Mj+1a of the (j+1)th demultiplexer DMj+1 may maintain or substantially maintain an on-state during the same period, and the on-off operation of each of the second transistor Mjb of the jth demultiplexer DMj and the first transistor Mj+1a of the (j+1)th demultiplexer DMj+1 may be controlled by the second driving signal Cd2.

When data signals are supplied to the two data lines Djb and Dj+1a that are adjacent to each other at different times, respectively, a change in voltage generated in any one data line may cause a change in voltage of the other data line, and therefore, an undesired coupling noise may occur in the other data line. Thus, according to an embodiment of the present disclosure, the data signal is applied to the two data lines Djb and Dj+1a that are adjacent to each other concurrently (e.g., at the same or substantially the same time), so that the coupling noise may be reduced or removed. Accordingly, a high-quality image may be realized.

In addition, the two data lines located most distant from each other from among the four data lines Dja, Djb, Dj+1a, and Dj+1b, and located in the two adjacent pixel columns PRj and PRj+1, respectively, may receive a data signal input during the same period. To this end, the first transistor Mja of the jth demultiplexer DMj and the second transistor Mj+1b of the (j+1)th demultiplexer DMj+1 may maintain or substantially maintain the on-state during the same period, and the on-off operation of each of the first transistor Mja of the jth demultiplexer DMj and the second transistor Mj+1b of the (j+1)th demultiplexer DMj+1 may be controlled by the first driving signal Cd1.

Figure 3:
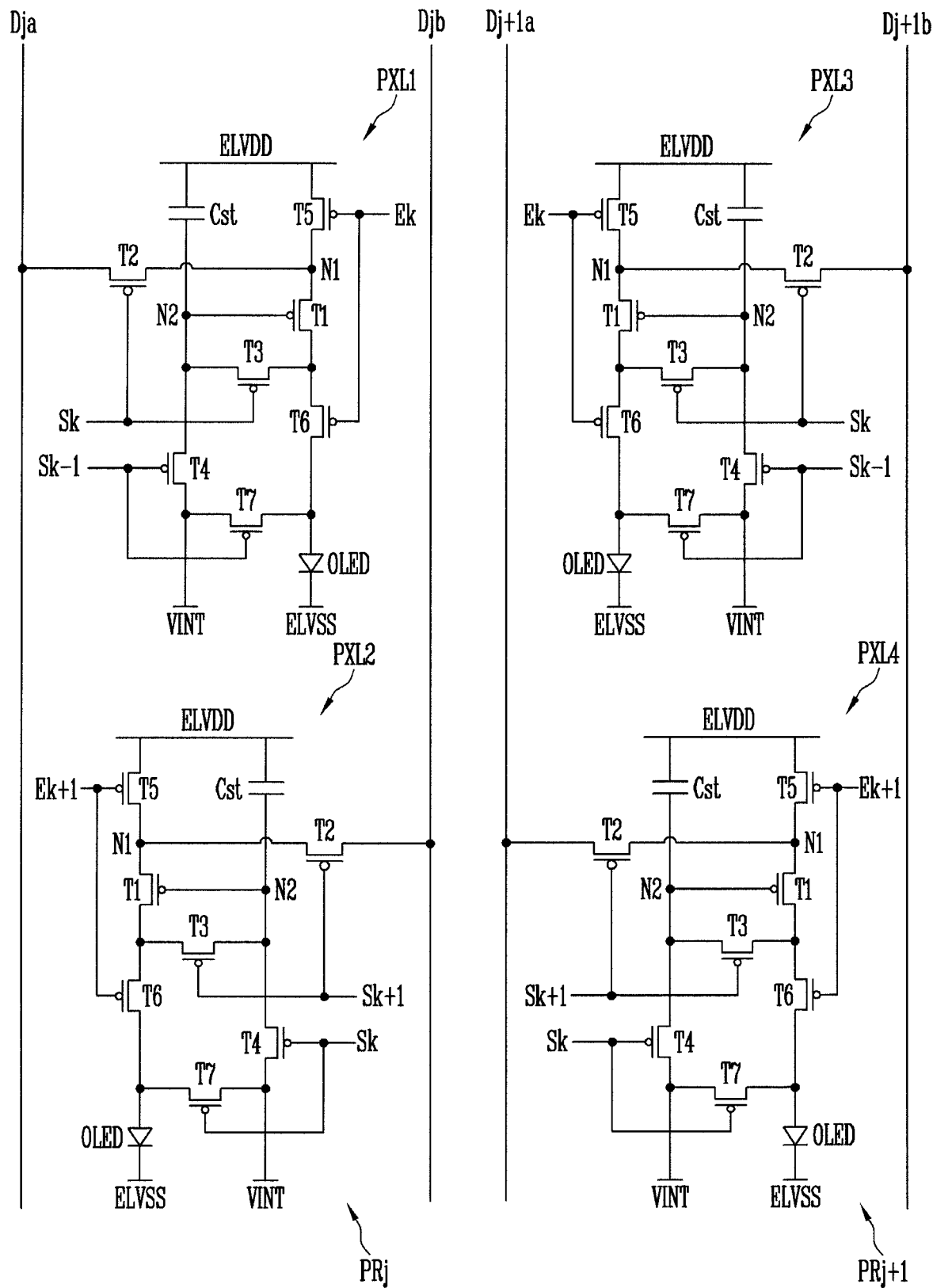
FIG. 3 is a diagram illustrating pixels in more detail, according to an embodiment of the present disclosure.

FIG. 3 is a diagram illustrating pixels in more detail, according to an embodiment of the present disclosure. For convenience of description, the jth pixel column PRj and the (j+1)th pixel column PRj+1, which are located adjacent to each other, are mainly illustrated.

Referring to FIG. 3, the first pixel PXL1 may include a pixel circuit and an organic light emitting diode OLED.

An anode electrode of the organic light emitting diode OLED may be connected to the pixel circuit, and a cathode electrode of the organic light emitting diode OLED may be connected to the second power source ELVSS. The organic light emitting diode OLED may generate light with a luminance (e.g., a predetermined luminance) corresponding to the amount of current supplied from the pixel circuit. The first power source ELVDD, which is supplied to the anode electrode to enable current to flow in the organic light emitting diode OLED, may be set to a voltage level higher than that of the second power source ELVSS.

The pixel circuit may control the amount of current flowing from the first power source ELVDD and the second power source ELVSS via the organic light emitting diode OLED, corresponding to a data signal. To this end, the pixel circuit may include a first transistor T1, a second transistor T2, a third transistor T3, a fourth transistor T4, a fifth transistor T5, a sixth transistor T6, a seventh transistor T7, and a storage capacitor Cst.

A first electrode of the first transistor (e.g., a driving transistor) T1 may be connected to a first node N1, and a second electrode of the first transistor T1 may be connected to a first electrode of the sixth transistor T6. In addition, a gate electrode of the first transistor T1 may be connected to a second node N2. The first transistor T1 may control the amount of current supplied from the first power source ELVDD to the second power source ELVSS via the organic light emitting diode OLED, corresponding to a voltage stored in the storage capacitor Cst.

The second transistor T2 may be connected between the jth first sub-data line Dja and the first node N1. In addition, a gate electrode of the second transistor T2 may be connected to a kth scan line Sk. The second transistor T2 may be turned on when a scan signal is supplied to the kth scan line Sk, to allow the jth first sub-data line Dja and the first node N1 to be electrically connected to each other.

The third transistor T3 may be connected between the second electrode of the first transistor T1 and the second node N2. In addition, a gate electrode of the third transistor T3 may be connected to the kth scan line Sk. The third transistor T3 may be turned on when the scan signal is supplied to the kth scan line Sk to diode-connect the first transistor T1.

The fourth transistor T4 may be connected between the second node N2 and the third power source VINT. In addition, a gate electrode of the fourth transistor T4 may be connected to a (k−1)th scan line Sk−1. The fourth transistor T4 may be turned on when the scan signal is supplied to the (k−1)th scan line Sk−1 to supply a voltage of the third power source VINT to the second node N2.

The fifth transistor T5 may be connected between the first power source ELVDD and the first node N1. In addition, a gate electrode of the fifth transistor T5 may be connected to a kth emission control line Ek. The fifth transistor T5 may be turned off when an emission control signal is supplied to the kth emission control line Ek, and be turned on when the emission control signal is not supplied.

The sixth transistor T6 may be connected between the second electrode of the first transistor T1 and the anode electrode of the organic light emitting diode OLED. In addition, a gate electrode of the sixth transistor T6 may be connected to the kth emission control line Ek. The sixth transistor T6 may be turned off when the emission control signal is supplied to the kth emission control line Ek, and be turned on when the emission control signal is not supplied.

The seventh transistor T7 may be connected between the anode electrode of the organic light emitting diode OLED and the third power source VINT. In addition, a gate electrode of the seventh transistor T7 may be connected to the (k−1)th scan line Sk−1. The seventh transistor T7 may be turned on when the scan signal is supplied to the (k−1)th scan line Sk−1 to supply the voltage of the third power source VINT to the anode electrode of the organic light emitting diode OLED.

However, the present disclosure is not limited thereto, for example, in another embodiment, the gate electrode of the seventh transistor T7 may be connected to the kth scan line Sk or to a (k+1)th scan line Sk+1.

The voltage of the third power source VINT may be set to a voltage lower than that of the data signal. When the voltage of the third power source VINT is supplied to the anode electrode of the organic light emitting diode OLED, a parasitic capacitor of the organic light emitting diode OLED is discharged. When an organic capacitor (e.g., the parasitic capacitor) is discharged, the black expression ability of the pixel PXL may be improved.

The storage capacitor Cst may be connected between the first power source ELVDD and the second node N2. The storage capacitor Cst may store a voltage corresponding to the data signal and a threshold voltage of the first transistor T1.

Here, the first electrode of each of the transistors T1, T2, T3, T4, T5, T6, and T7 may be any one of a source electrode and a drain electrode, and the second electrode of each of the transistors T1, T2, T3, T4, T5, T6, and T7 may be an electrode different from the first electrode. For example, when the first electrode is the source electrode, the second electrode may be the drain electrode.

The second pixel PXL2 may be alternately disposed with the first pixel PXL1 on the same pixel column PRj. The second pixel PXL2 may have a circuit configuration similar to or substantially the same as that of the first pixel PXL1.

However, the second pixel PXL2 is located on the next horizontal line (or pixel row), as compared with the first pixel PXL1. Therefore, the second pixel PXL2 may be connected to the kth scan line Sk, the (k+1)th scan line Sk+1, and a (k+1)th emission control line Ek+1.

In this case, a gate electrode of a second transistor T2 and a gate electrode of a third transistor T3 may be connected to the (k+1)th scan line Sk+1, a gate electrode of a fourth transistor T4 and a gate electrode of a seventh transistor T7 may be connected to the kth scan line Sk, and a gate electrode of a fifth transistor T5 and a gate electrode of a sixth transistor T6 may be connected to the (k+1)th emission control line Ek+1.

In addition, the second pixel PXL2 may be connected to a jth second sub-data line Djb. Here, the second transistor of the second pixel PXL2 may be connected between the jth second sub-data line Djb and a first node N1.

The third pixel PXL3 may have a circuit configuration similar to or substantially the same as that of the first pixel PXL1, and may be disposed on the same horizontal line (or pixel row) as that of the first pixel PXL1. Therefore, like the first pixel PXL1, the third pixel PXL3 may be connected to the (k−1)th scan line Sk−1, the kth scan line Sk, and the kth emission control line Ek. However, because the third pixel PXL3 is located on a different pixel column PRj+1 from that of the first pixel PXL1, the third pixel PXL3 may be connected to a (j+1)th second sub-data line Dj+1b. Here, a second transistor T2 of the third pixel PXL3 may be connected between the (j+1)th second sub-data line Dj+1b and a first node N1.

The fourth pixel PXL4 may be alternately disposed with the third pixel PXL3 on the same pixel column PRj+1. The fourth pixel PXL4 may have a circuit configuration similar to or substantially the same as that of the third pixel PXL3. However, the fourth pixel PXL4 is located on the next horizontal line (or pixel row), as compared with the third pixel PXL3. Therefore, the fourth pixel PXL4 may be connected to the kth scan line Sk, the (k+1)th scan line Sk+1, and the (k+1)th emission control line Ek+1. In the fourth pixel PXL4, a gate electrode of a second transistor T2 and a gate electrode of the third transistor T3 may be connected to the (k+1)th scan line Sk+1, a gate electrode of a fourth transistor T4 and a gate electrode of a seventh transistor T7 may be connected to the kth scan line Sk, and a gate electrode of a fifth transistor T5 and a gate electrode of a sixth transistor T6 may be connected to the (k+1)th emission control line Ek+1.

The fourth pixel PXL4 may be connected to a (j+1)th first sub-data line Dj+1a. Here, the second transistor T2 of the fourth pixel PXL4 may be connected between the (j+1)th first sub-data line Dj+1a and a first node N1.

Two sub-data lines Djb and Dj+1a that are adjacent to each other from among the four sub-data lines Dja, Djb, Dj+1a, and Dj+1b, and located in two pixel columns that are adjacent to each other (e.g., the jth pixel column and the (j+1)th pixel column), respectively, may be connected to pixels located on the same pixel row. In addition, two sub-data lines Dja and Dj+1b that are located most distant from each other from among the four sub-data lines Dja, Djb, Dj+1a, and Dj+1b, and located in the two pixel columns adjacent to each other, respectively, may be connected to pixels located on the same pixel row.

Figure 4:
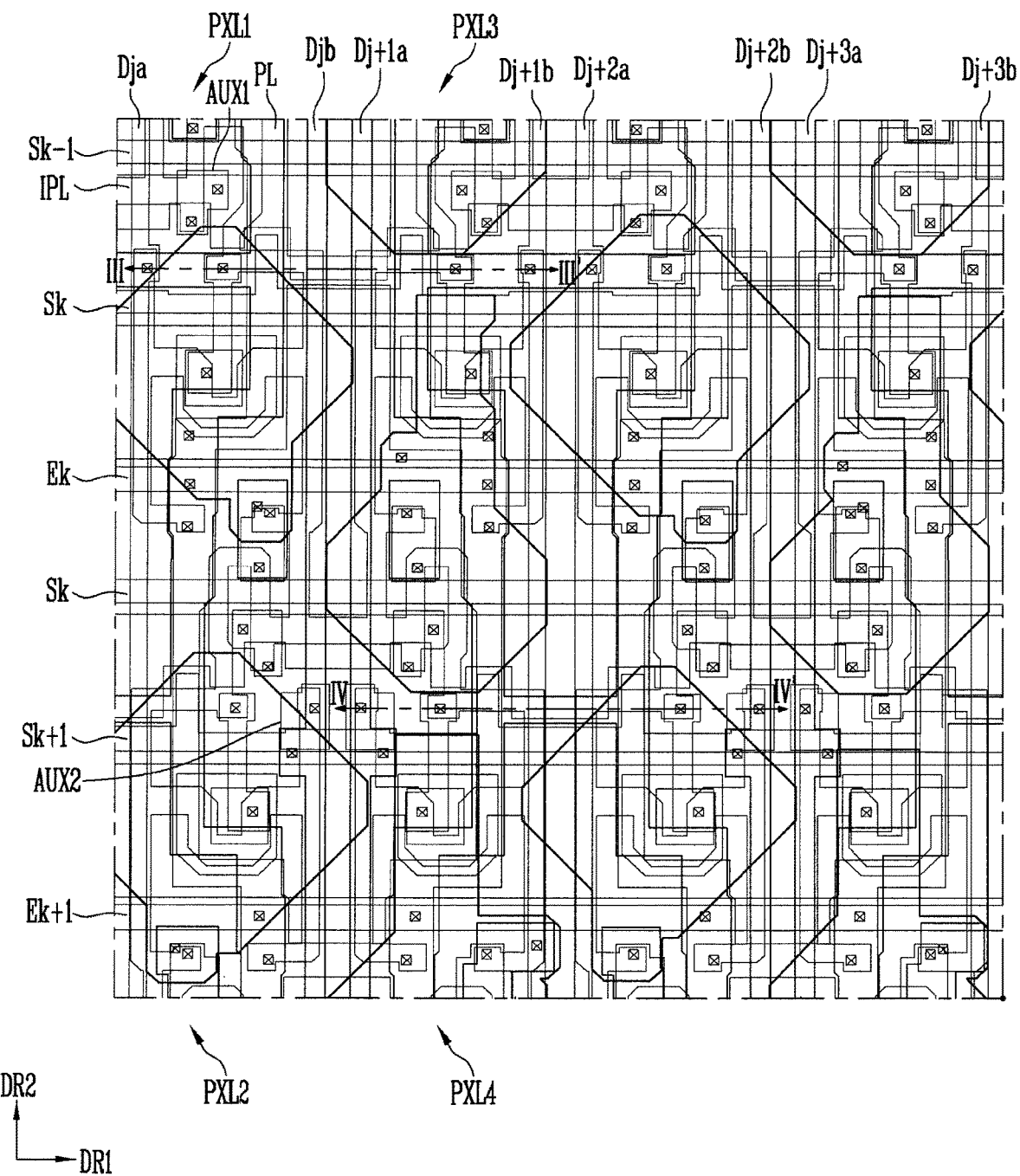
FIG. 4 is a plan view illustrating pixels disposed at crossing regions of a kth pixel row, a (k+1)th pixel row, a jth pixel column, a (j+1)th pixel column, a (j+2)th pixel column, and a (j+3)th pixel column in the display device according to an embodiment of the present disclosure.
Figure 5:
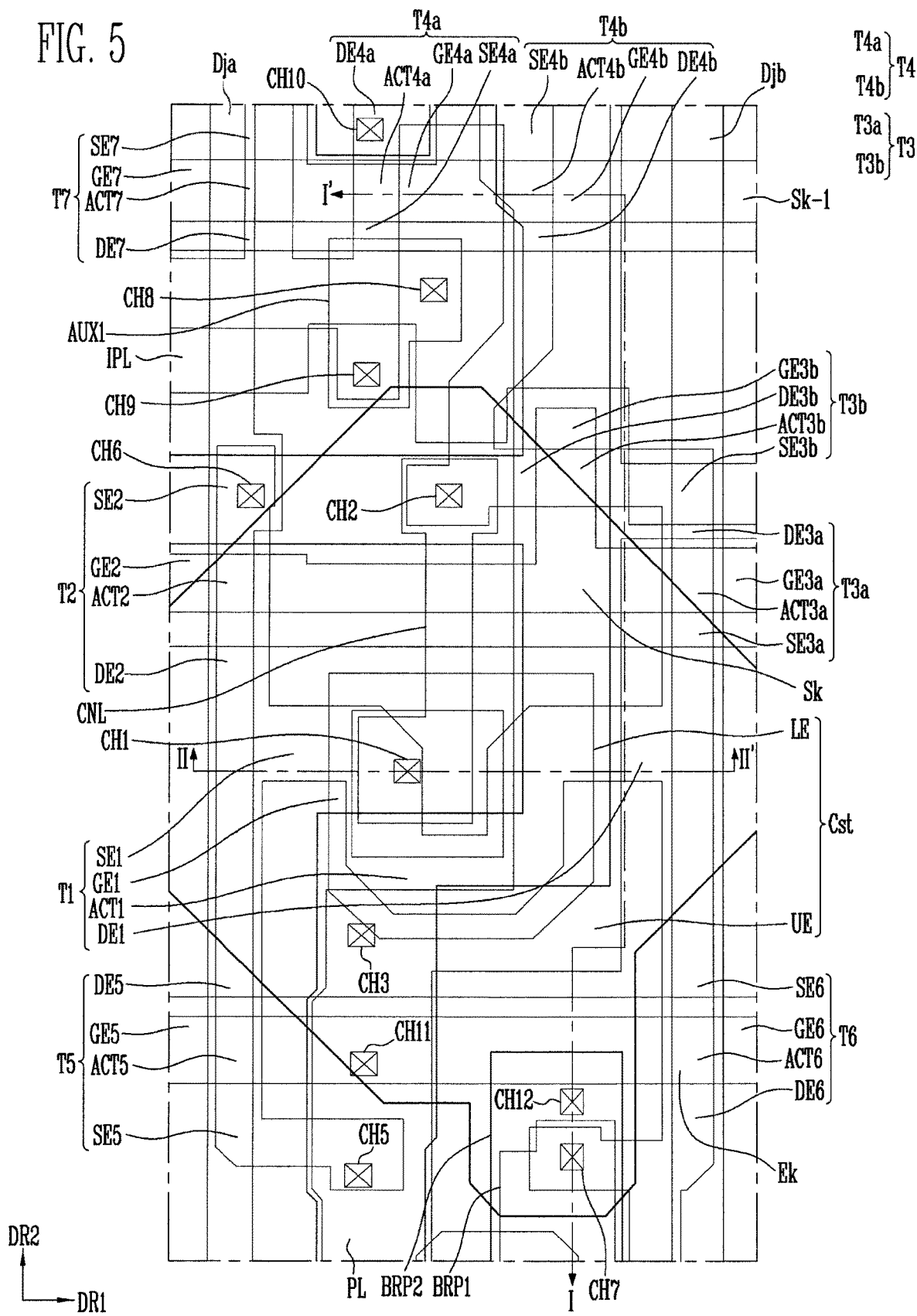
FIG. 5 is a plan view illustrating a pixel disposed at a crossing region of the kth pixel row and the jth pixel column, shown in FIG. 4.
Figure 6:
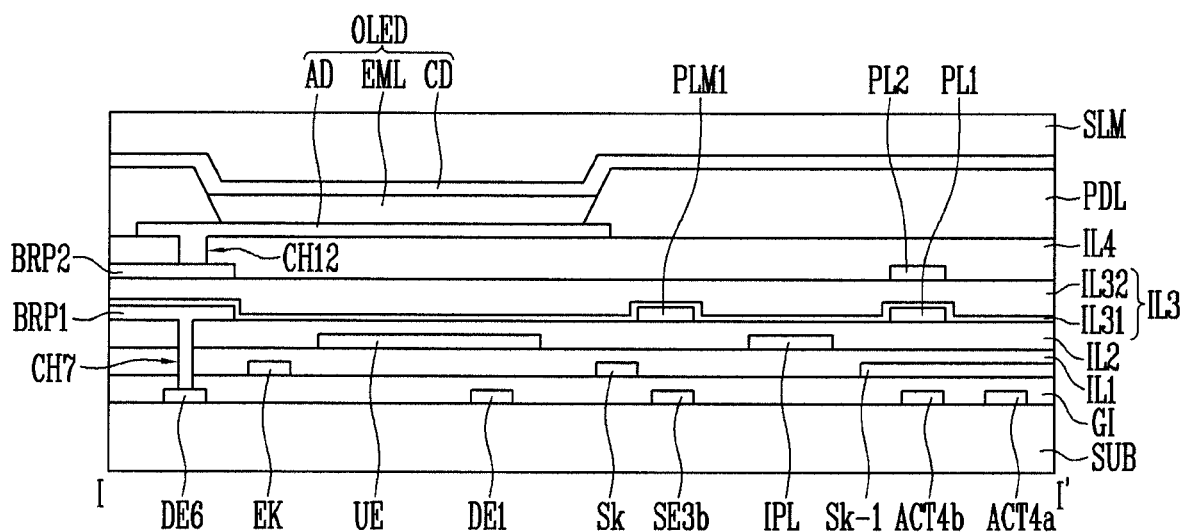
FIG. 6 is a sectional view taken along the line I-I' of FIG. 5.
Figure 7:
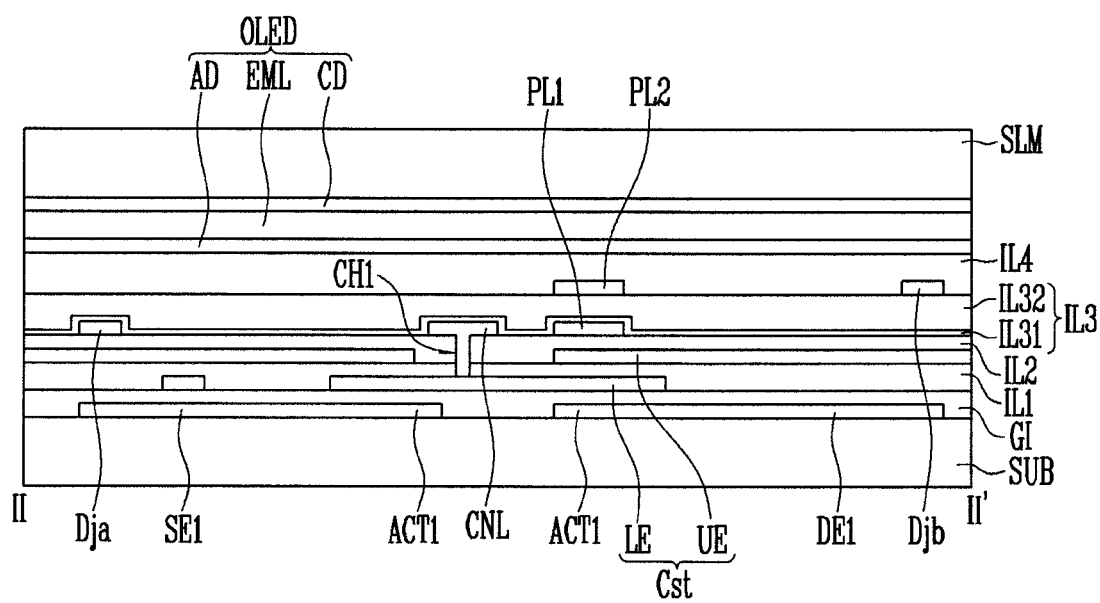
FIG. 7 is a sectional view taken along the line II-II' of FIG. 5.
Figure 8:
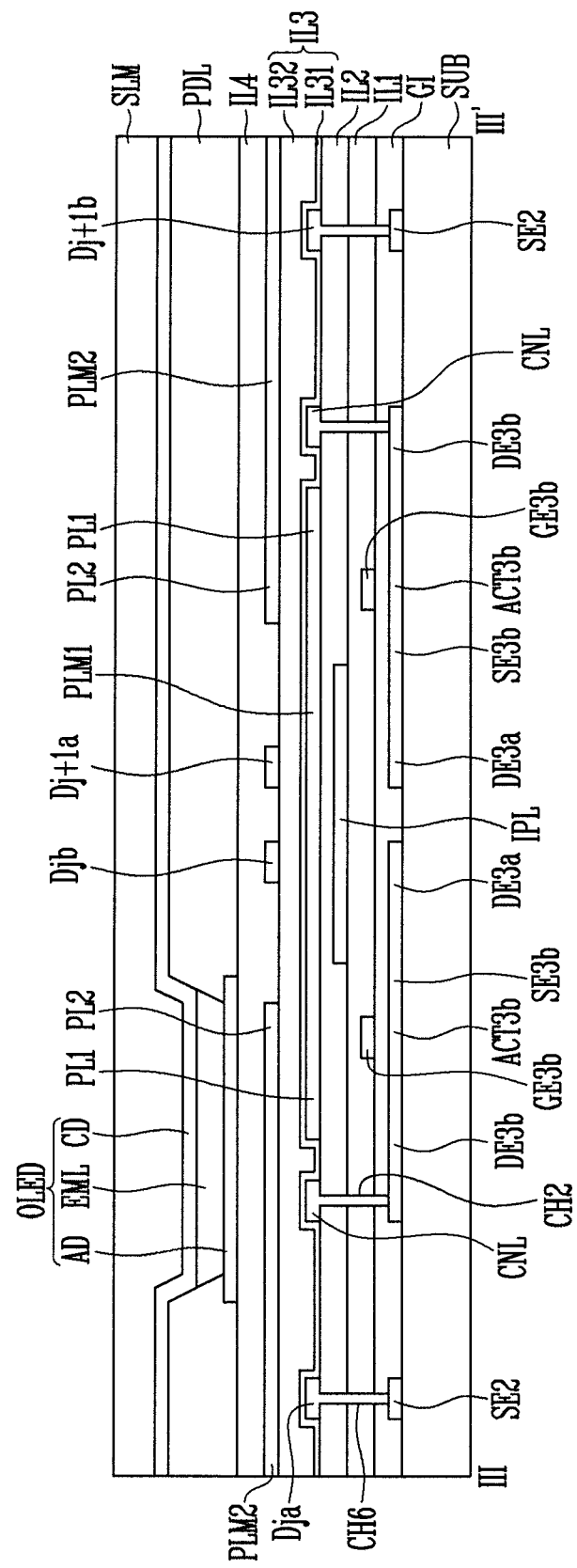
FIG. 8 is a sectional view taken along the line III-III' of FIG. 4.
Figure 9:
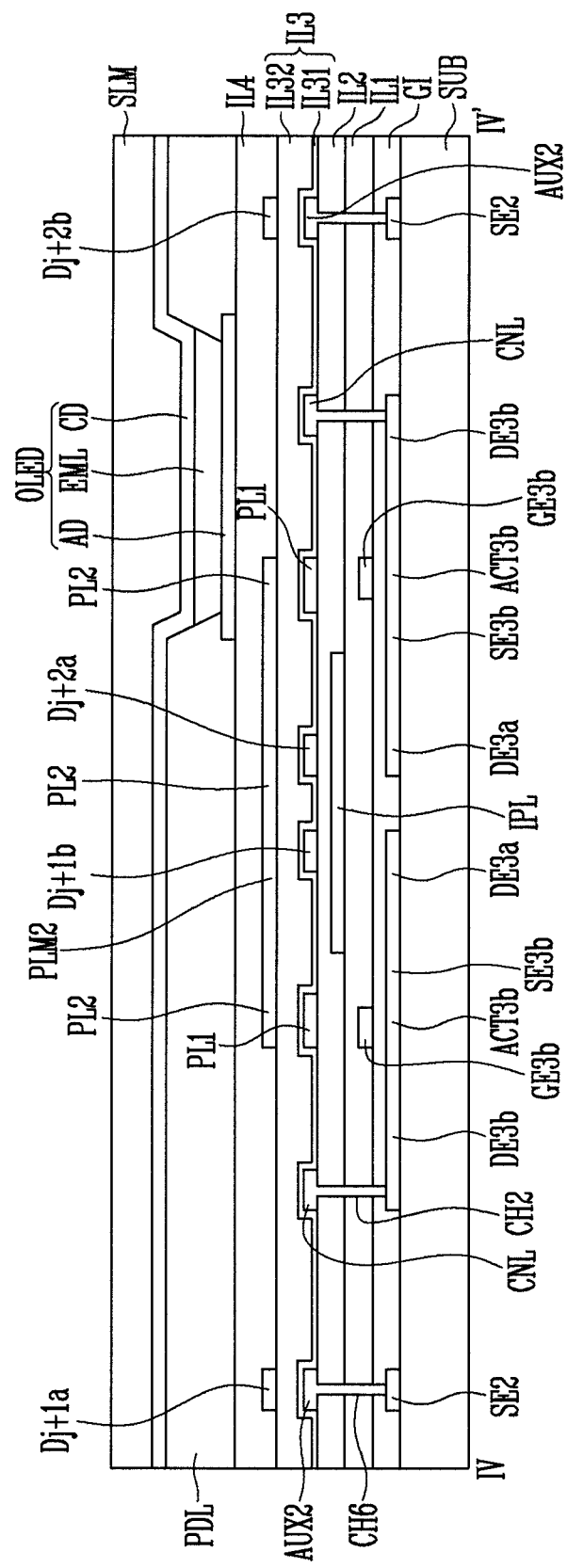
FIG. 9 is a sectional view taken along the line IV-IV' of FIG. 4.

FIG. 4 is a plan view illustrating pixels disposed at crossing regions of a kth pixel row, a (k+1)th pixel row, a jth pixel column, a (j+1)th pixel column, a (j+2)th pixel column, and a (j+3)th pixel column in the display device, according to an embodiment of the present disclosure. FIG. 5 is a plan view illustrating a pixel disposed at a crossing region of the kth pixel row and the jth pixel column, shown in FIG. 4. FIG. 6 is a sectional view taken along the line I-I' of FIG. 5. FIG. 7 is a sectional view taken along the line II-II' of FIG. 5. FIG. 8 is a sectional view taken along the line III-III' of FIG. 4. FIG. 9 is a sectional view taken along the line IV-IV' of FIG. 4.

Referring to FIGS. 1 to 9, the display device may include a substrate SUB and pixels provided on the substrate SUB.

The substrate SUB may include a transparent insulating material to enable light to be transmitted therethrough. In some embodiments, the substrate SUB may be a rigid substrate. For example, the substrate SUB may be one of a glass substrate, a quartz substrate, a glass ceramic substrate, and a crystalline glass substrate.

In other embodiments, the substrate SUB may be a flexible substrate. Here, the substrate SUB may be one of a film substrate including a polymer organic material and a plastic substrate. For example, the substrate SUB may include at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and for example, may include a fiber reinforced plastic (FRP), etc.

The pixels PXL may be arranged in a matrix form along a plurality of pixel rows extending in a first direction DR1 and a plurality of pixel columns extending in a second direction DR2 crossing the first direction. That is, the pixel rows may include pixels PXL arranged in the first direction DR1 and the pixel columns may include pixels PXL arranged in the second direction DR2.

The pixels PXL may include a first pixel PXL1, a second pixel PXL2, a third pixel PXL3, and a fourth pixel PXL4. The first pixel PXL1 may be a pixel disposed at a crossing region of a kth pixel row and a jth pixel column, the second pixel PXL2 may be a pixel disposed at a crossing region of a (k+1)th pixel row and the jth pixel column, the third pixel PXL3 may be a pixel disposed at a crossing region of the kth pixel row and a (j+1)th pixel column, and the fourth pixel PXL4 may be a pixel disposed at a crossing region of the (k+1)th pixel row and the (j+1)th pixel column.

The pixels PXL may be connected to scan lines Sk−1, Sk, and Sk+1, data lines Dja, Djb, Dj+1a, Dj+1b, Dj+2a, Dj+2b, Dj+3a, and Dj+3b, emission control lines Ek and Ek+1, a power line PL, and an initialization power line IPL.

The scan lines Sk−1, Sk, and Sk+1 may extend in the first direction DR1. The scan lines Sk−1, Sk, and Sk+1 may include a (k−1)th scan line Sk−1, a kth scan line Sk, and a (k+1)th scan line Sk+1, which are sequentially arranged along the second direction DR2. The scan lines Sk−1, Sk, and Sk+1 may receive scan signals applied thereto. For example, the (k−1)th scan line Sk−1 may receive a (k−1)th scan signal applied thereto. The (k−1)th scan line Sk−1 may initialize pixels PXL on the kth pixel row by the (k−1)th scan signal. The kth scan line Sk may receive a kth scan signal applied thereto. The (k+1)th scan line Sk+1 may receive a (k+1)th scan signal applied thereto.

The data lines Dja, Djb, Dj+1a, Dj+1b, Dj+2a, Dj+2b, Dj+3a, and Dj+3b may extend in the second direction DR2. The data lines Dja, Djb, Dj+1a, Dj+1b, Dj+2a, Dj+2b, Dj+3a, and Dj+3b may include jth data lines Dja and Djb, (j+1)th data lines Dj+1a and Dj+1b, (j+2)th data lines Dj+2a and Dj+2b, and (j+3)th data lines Dj+3a and Dj+3b, which are sequentially arranged along the first direction DR1.

The jth data lines Dja and Djb, the (j+1)th data lines Dj+1a and Dj+1b, the (j+2)th data lines Dj+2a and Dj+2b, and the (j+3)th data lines Dj+3a and Dj+3b may include first sub-data lines Dja, Dj+1a, Dj+2a, and Dj+3a and second sub-data lines Djb, Dj+1b, Dj+2b, and Dj+3b, respectively. The first sub-data lines Dja, Dj+1a, Dj+2a, and Dj+3a and the second sub-data lines Djb, Dj+1b, Dj+2b, and Dj+3b may be provided at sides (e.g., both sides) of respective pixel columns. For example, the first sub-data lines Dja, Dj+1a, Dj+2a, and Dj+3a may be provided at one sides of the pixel columns, respectively, and the second sub-data lines Djb, Dj+1b, Dj+2b, and Dj+3b may be provided at the other sides of the pixel columns, respectively.

The emission control lines Ek and Ek+1 may extend in the first direction. The kth emission control line Ek may be disposed between the kth scan lines Sk to be spaced apart from the kth scan lines Sk. The (k+1)th emission control lines Ek+1 may be disposed between the (k+1)th scan lines Sk+1 to be spaced apart from the (k+1)th scan lines Sk+1. The emission control lines Ek and Ek+1 may receive an emission control signal applied thereto.

The power line PL may be provided to be spaced apart from the data lines Dja, Djb, Dj+1a, Dj+1b, Dj+2a, Dj+2b, Dj+3a, and Dj+3b. For example, the power line PL may be provided between the first sub-data lines Dja, Dj+1a, Dj+2a, and Dj+3a and the second sub-data lines Djb, Dj+1b, Dj+2b, and Dj+3b. The power line PL may receive one of the first power source ELVDD and the second power source ELVSS, e.g., the first power source ELVDD, which is applied thereto.

The initialization power line IPL may extend along the first direction DR1. The initialization power line IPL may be between pixels PXL on the kth pixel row and pixels PXL on the (k+1)th row. The initialization power line IPL may receive the initialization power source VINT applied thereto.

Hereinafter, the first pixel PXL1 disposed on the kth pixel row and the jth pixel column will be described in more detail.

The first pixel PXL1 may be connected to the (k−1)th scan line Sk−1, the kth scan line Sk, the first sub-data line Dja from among the jth data lines Dja and Djb, the kth emission control line Ek, the power line PL, and the initialization power line IPL.

The first pixel PXL1 may include first to seventh transistors T1 to T7, a storage capacitor Cst, and a display element OLED.

The first transistor T1 may include a first gate electrode GE1, a first active pattern ACT1, a first source electrode SE1, a first drain electrode DE1, and a connection line CNL.

The first gate electrode GE1 may be connected to a third drain electrode DE3 of the third transistor T3 and a fourth drain electrode DE4 of the fourth transistor T4. The connection line CNL may be connected between the first gate electrode GE1 and the third and fourth drain electrodes DE3 and DE4. One end of the connection line CNL may be connected to the first gate electrode GE1 through a first contact hole CH1, and the other end of the connection line CNL may be connected to the third and fourth drain electrodes DE3 and DE4 through a second contact hole CH2.

In an embodiment of the present disclosure, the first active pattern ACT1, the first source electrode SE1, and the first drain electrode DE1 may be formed of a semiconductor layer that is undoped or doped with impurities. For example, the first source electrode SE1 and the first drain electrode DE1 may be formed of a semiconductor layer that is doped with impurities, and the active pattern ACT1 may be formed of a semiconductor layer that is undoped with impurities.

The first active pattern ACT1 has a bar shape extending in a direction (e.g., a predetermined direction), and may have a shape having a plurality of bends along the extending direction. The first active pattern ACT1 may overlap with the first gate electrode GE1 when viewed on a plane. As the first active pattern ACT1 is formed long, a channel region of the first transistor T1 may be formed long. Thus, the driving range of a gate voltage applied to the first transistor T1 may be widened. Accordingly, a gray scale level (or gray level) of light to be emitted from the organic light emitting diode OLED may be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the kth scan line Sk. The second gate electrode GE2 may be provided as a portion of the kth scan line Sk or may be provided in a shape protruding from the kth scan line Sk. In an embodiment of the present disclosure, the second active pattern ACT2, the second source electrode SE2, and the second drain electrode DE2 may be formed of a semiconductor layer that is undoped or doped with impurities. For example, the second source electrode SE2 and the second drain electrode DE2 may be formed of a semiconductor layer that is doped with impurities, and the second active pattern ACT2 may be formed of a semiconductor layer that is undoped with impurities. The second active pattern ACT2 corresponds to a portion overlapping with the second gate electrode GE2. One end of the second source electrode SE2 may be connected to the second active pattern ACT2. The other end of the second source electrode SE2 may be connected to the data line Dja through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a double gate structure to prevent or substantially prevent a leakage current. That is, the third transistor T3 may include a 3ath transistor T3a and a 3bth transistor T3b. The 3ath transistor T3a may include a 3ath gate electrode GE3a, a 3ath active pattern ACT3a, a 3ath source electrode SE3a, and a 3ath drain electrode DE3a. The 3bth transistor T3b may include a 3bth gate electrode GE3b, a 3bth active pattern ACT3a, a 3bth source electrode SE3b, and a 3bth drain electrode DE3b. Hereinafter, the 3ath gate electrode GE3a and the 3bth gate electrode GE3b are referred to as a third gate electrode GE3, the 3ath active pattern ACT3a and the 3bth active pattern ACT3b are referred to as a third active pattern ACT3, the 3ath source electrode SE3a and the 3bth source electrode SE3b are referred to as the third source electrode SE3, and the 3*ath* drain electrode DE3*a* and the 3*bth* drain electrode DE3*b* are referred to as the third drain electrode DE3.

The third gate electrode GE3 may be connected to the kth scan line Sk. The third gate electrode GE3 may be provided as a portion of the ith scan line Si and/or may be provided in a shape protruding from the kth scan line Sk. For example, the 3*ath* gate electrode GE3*a* may be provided as a portion of the kth scan line Sk, and the 3*bth* gate electrode GE3*b* may be provided in a shape protruding from the kth scan line Sk.

The third active pattern ACT3, the third source electrode SE3, and the third drain electrode DE3 may be formed of a semiconductor layer that is undoped or doped with impurities. For example, the third source electrode SE3 and the third drain electrode DE3 may be formed of a semiconductor layer that is doped with impurities, and the third active pattern ACT3 may be formed of a semiconductor layer that is undoped with impurities. The third active pattern ACT3 corresponds to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the connection line CNL, the second contact hole CH2, and the first contact hole CH1.

The fourth transistor T4 may be provided in a double gate structure to prevent or substantially prevent a leakage current. That is, the fourth transistor T4 may include a 4*ath* transistor T4*a* and a 4*bth* transistor T4*b*. The 4*ath* transistor T4*a* may include a 4*ath* gate electrode GE4*a*, a 4*ath* active pattern ACT4*a*, a 4*ath* source electrode SE4*a*, and a 4*ath* drain electrode DE4*a*. The 4*bth* transistor T4*b* may include a 4*bth* gate electrode GE4*b*, a 4*bth* active pattern ACT4*b*, a 4*bth* source electrode SE4*b*, and a 4*bth* drain electrode DE4*b*. Hereinafter, the 4*ath* gate electrode GE4*a* and the 4*bth* gate electrode GE4*b* are referred to as a fourth gate electrode GE4, the 4*ath* active pattern ACT4*a* and the 4*bth* active pattern ACT4*b* are referred to as a fourth active pattern ACT4, the 4*ath* source electrode SE4*a* and the 4*bth* source electrode SE4*b* are referred to as a fourth source electrode SE4, and the 4*ath* drain electrode DE4*a* and the 4*bth* drain electrode DE4*b* are referred to as the fourth drain electrode DE4.

The fourth gate electrode GE4 may be connected to the (k−1)th scan line Sk−1. The fourth gate electrode GE4 may be provided as a portion of the (k−1)th scan line Sk−1 or may be provided in a shape protruding from the (k−1)th scan line Sk−1. For example, the 4*ath* gate electrode GE4*a* and the 4*bth* gate electrode GE4*b* may be provided as a portion of the (k−1)th scan line Sk−1.

The fourth active pattern ACT4, the fourth source electrode SE4, and the fourth drain electrode DE4 may be formed of a semiconductor layer that is undoped or doped with impurities. For example, the fourth source electrode SE4 and the fourth drain electrode DE4 may be formed of a semiconductor layer that is doped with impurities, and the fourth active pattern ACT4 may be formed of a semiconductor layer that is undoped with impurities. The fourth active pattern ACT4 corresponds to a portion overlapping with the fourth gate electrode GE4.

One end of the fourth source electrode SE4 may be connected to the fourth active pattern ACT4. The other end of the fourth source electrode SE4 may be connected to the initialization power line IPL and a seventh drain electrode DE7 of the seventh transistor T7. A first auxiliary connection line AUX1 may be provided between the fourth source electrode SE4 and the initialization power line IPL. One end of the first auxiliary connection line AUX1 may be connected to the fourth source electrode SE4 through a ninth contact hole CH9. The other end of the first auxiliary connection line AUX1 may be connected to the initialization power line IPL through an eighth contact hole CH8. One end of the fourth drain electrode DE4 may be connected to the fourth active pattern ACT4. The other end of the fourth drain electrode DE4 may be connected to the third drain electrode DE3 of the third transistor T3. Also, the fourth drain electrode DE4 may be connected to the first gate electrode GE1 of the first transistor T1 through the connection line CNL, the second contact hole CH2, and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the kth emission control line Ek. The fifth gate electrode GE5 may be provided as a portion of the kth emission control line Ek or may be provided in a shape protruding from the kth emission control line Ek. The fifth active pattern ACT, the fifth source electrode SE5, and the fifth drain electrode DE5 may be formed of a semiconductor layer that is undoped or doped with impurities. For example, the fifth source electrode SE5 and the fifth drain electrode DE5 may be formed of a semiconductor layer that is doped with impurities, and the fifth active pattern ACT5 may be formed of a semiconductor layer that is undoped with impurities. The fifth active pattern ACT5 corresponds to a portion overlapping with the fifth gate electrode GE5. One end of the fifth source electrode SE5 may be connected to the fifth active pattern ACT5. The other end of the fifth source electrode SE5 may be connected to the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be connected to the kth emission control line Ek. The sixth gate electrode GE6 may be provided as a portion of the kth emission control line Ek or may be provided in a shape protruding from the kth emission control line Ek. The sixth active pattern ACT6, the sixth source electrode SE6, and the sixth drain electrode DE6 may be formed of a semiconductor layer that is undoped or doped with impurities. For example, the sixth source electrode SE6 and the sixth drain electrode DE6 may be formed of a semiconductor layer that is doped with impurities, and the sixth active pattern ACT6 may be formed of a semiconductor layer that is undoped with impurities. The sixth active pattern ACT6 corresponds to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be connected to the (k−1)th scan line Sk−1. The seventh gate electrode GE7 may be provided as a portion of the (k−1)th scan line Sk−1 or may be provided in a shape protruding from the (k−1)th scan line Sk−1. The seventh active pattern ACT7, the seventh source electrode SE7, and the seventh drain electrode DE7 may be formed of a semiconductor layer that is undoped or doped with impurities. For example, the seventh source electrode SE7 and the seventh drain electrode DE7 may be formed of a semiconductor layer that is doped with impurities, and the seventh active layer ACT7 may be formed of a semiconductor layer that is undoped with impurities. The seventh active pattern ACT7 corresponds to a portion overlapping with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL. Also, the seventh drain electrode DE7 may be connected to the fourth source electrode SE4 of the fourth transistor T4. The seventh drain electrode DE7 may be connected to the fourth source electrode SE4 of the fourth transistor T4 through the first auxiliary connection line AUX1, the eighth contact hole CH8, and the ninth contact hole CH9.

The storage capacitor Cst may include a lower electrode LE and an upper electrode UE. The lower electrode LE may be provided as the first gate electrode GE1 of the first transistor T1.

The upper electrode UE overlaps with the first gate electrode GE1, and may overlap with (e.g., cover) the lower electrode LE when viewed on a plane. As the overlapping area of the upper electrode UE and the lower electrode LE is widened, the capacitance of the storage capacitor Cst may be increased. The upper electrode UE may extend in the first direction DR1. In an embodiment of the present disclosure, a voltage having the same or substantially the same level as that of the first power source ELVDD may be applied to the upper electrode UE. The upper electrode UE may have a region where a portion including the first contact hole CH1 through which the first gate electrode GE1 and the connection line CNL are in contact with each other is removed.

The display element OLED may include a first electrode AD, a second electrode CD, and an emitting layer EML provided between the first electrode AD and the second electrode CD.

The first electrode AD may be provided corresponding to a light emitting region of the first pixel PXL1. The light emitting region of the first pixel PXL1 may overlap with the first electrode AD. The first electrode AD may be connected to the sixth drain electrode DE6 of the sixth transistor T6 through a seventh contact hole CH7, a tenth contact hole CH10, and a twelfth contact hole CH12. A first bridge pattern BRP1 may be provided between the seventh contact hole CH7 and the tenth contact hole CH10. A second bridge pattern BRP2 may be provided between the tenth contact hole CH10 and the twelfth contact hole CH12. The first bridge pattern BRP1 and the second bridge pattern BRP2 may connect the first electrode AD to the sixth drain electrode DE6.

The second pixel PXL2 on the (k+1)th pixel row and the jth pixel column, the third pixel PXL3 on the kth pixel row and the (j+1)th pixel column, and the fourth pixel PXL4 on the (k+1)th pixel row and the (j+1)th pixel column may each have a structure similar to or substantially the same as that of the first pixel PXL1, except for data lines, scan lines, and emission control lines that are connected thereto.

The second pixel PXL2 may be connected to the kth scan line Sk, the (k+1)th scan line Sk+1, the second sub-data line Djb from among the jth data lines Dja and Djb, the (k+1)th emission control line Ek+1, the power line PL, and the initialization power line IPL.

The third pixel PXL3 may be connected to the (k−1)th scan line Sk−1, the kth scan line Sk, the second sub-data line Dj+1b from among the (j+1)th data lines Dj+1a and Dj+1b, the kth emission control line Ek, the power line PL, and the initialization power line IPL.

The fourth pixel PXL4 may be connected to the kth scan line Sk, the (k+1)th scan line Sk+1, the first sub-data line Dj+1a from among the (j+1)th data lines Dj+1a and Dj+1b, the (k+1)th emission control line Ek+1, the power line PL, and the initialization power line IPL.

In addition, the second pixel PXL2 and the fourth pixel PXL4 may further include a second auxiliary connection line AUX2 for connecting a second source electrode SE2 of a second transistor T2 to a corresponding one of the data lines Djb and Dj+1a. One end of the second auxiliary connection line AUX2 may be connected to the second source electrode SE2 through a sixth contact hole CH6, and the other end of the second auxiliary connection line AUX2 may be connected to the corresponding one of the data lines Djb and Dj+1a through a fourth contact hole CH4 (e.g., see FIG. 14).

Hereinafter, a structure of the first pixel PXL1 according to an embodiment of the present disclosure will be described along a stacking order with reference to FIGS. 4 to 9.

A semiconductor pattern may be provided on the substrate SUB. The semiconductor pattern may include the first to seventh active patterns ACT1 to ACT7, the first to seventh source electrodes SE1 to SE7, and the first to seventh drain electrodes DE1 to DE7. The semiconductor pattern may include a semiconductor material.

A buffer layer may be provided between the substrate SUB and the semiconductor pattern.

The buffer layer may prevent or substantially prevent impurities from being diffused into the first to seventh active patterns ACT1 to ACT7 from the substrate SUB. The buffer layer may be provided in a single-layer structure, or may be provided in a multi-layer structure including at least two layers. The buffer layer may include at least one of an organic insulating layer and an inorganic insulating layer. The organic insulating layer may include an organic insulating material to allow light to be transmitted therethrough. The inorganic insulating layer may include at least one of silicon oxide, silicon nitride, and silicon oxynitride. When the buffer layer is provided in multiple layers, the layers may include the same or substantially the same material or may include different materials. For example, the inorganic insulating layer may include a first layer including silicon oxide and a second layer including silicon nitride.

A gate insulating layer GI may be provided on the substrate SUB on which the semiconductor pattern is formed.

The gate insulating layer GI may include at least one of an organic insulating layer and an inorganic insulating layer. The organic insulating layer may include an organic insulating material to allow light to be transmitted therethrough. For example, the organic insulating layer may include at least one of photoresist, polyacrylate resin, epoxy resin, phenolic resin, polyamide resin, polyimide resin, unsaturated polyester resin, polyphenylene ether resin, polyphenylene sulfide resin, and benzocyclobutene resin. The inorganic insulating layer may include at least one of silicon oxide, silicon nitride, and silicon oxynitride.

The (k−1)th scan line Sk−1, the kth scan line Sk, the kth emission control line Ek, and the first to seventh gate electrodes GE1 to GE7 may be provided on the gate insulating layer GI. The first gate electrode GE1 may also be the lower electrode LE of the storage capacitor Cst. The second gate electrode GE2 and the third gate electrode GE3 may be integrally formed with the kth scan line Sk. The fourth gate electrode GE4 and the seventh gate electrodes GE7 may be integrally formed with the (k−1)th scan line Sk−1. The fifth gate electrode GE5 and the sixth gate electrode GE6 may be integrally formed with the kth emission control line Ek.

The (k−1)th scan line Sk−1, the kth scan line Sk, the kth emission control line Ek, and the first to seventh gate electrodes GE1 to GE7 may include a metallic material. For example, the (k−1)th scan line Sk−1, the kth scan line Sk, the kth emission control line Ek, and the first to seventh gate electrodes GE1 to GE7 may include at least one of gold (Au), silver (Ag), aluminum (Al), molybdenum (Mo), chromium (Cr), titanium (Ti), nickel (Ni), neodymium (Nd), copper (Co), and any suitable alloy thereof. The (k−1)th scan line Sk−1, the kth scan line Sk, the kth emission control line Ek, and the first to seventh gate electrodes GE1 to GE7 may be formed in a single-layer structure, but the present disclosure is not limited thereto. For example, the (k−1)th scan line Sk−1, the kth scan line Sk, the kth emission control line Ek, and the first to seventh gate electrodes GE1 to GE7 may be formed in a multi-layer structure in which two or more layers including at least one of gold (Au), silver (Ag), aluminum (Al), molybdenum (Mo), chromium (Cr), titanium (Ti), nickel (Ni), neodymium (Nd), copper (Co), and any suitable alloy thereof are stacked.

A first interlayer insulating layer IL1 may be provided on the substrate SUB on which the (k−1)th scan line Sk−1 and the like are formed. The first interlayer insulating layer IL1 may include at least one of polysiloxane, silicon oxide, silicon nitride, and silicon oxynitride.

The upper electrode UE of the storage capacitor Cst and the initialization power line IPL may be provided on the first interlayer insulating layer IL1. The upper electrode UE may overlap with (e.g., cover) the lower electrode LE. The upper electrode UE along with the lower electrode LE may constitute the storage capacitor Cst with the first interlayer insulating layer IL1 interposed therebetween. The upper electrode UE and the initialization power line IPL may be formed in a single-layer or multi-layer structure, including at least one of gold (Au), silver (Ag), aluminum (Al), molybdenum (Mo), chromium (Cr), titanium (Ti), nickel (Ni), neodymium (Nd), copper (Co), and any suitable alloy thereof.

A second interlayer insulating layer IL2 may be provided on the substrate SUB on which the upper electrode UE and the initialization power line IPL are disposed.

The second interlayer insulating layer IL2 may include at least one of an inorganic insulating layer and an organic insulating layer. For example, the second interlayer insulating layer IL2 may include at least one inorganic insulating layer. The inorganic insulating layer may include at least one of silicon oxide, silicon nitride, and silicon oxynitride. Also, the second interlayer insulating layer IL2 may include at least one organic insulating layer. The organic insulating layer may include at least one of photoresist, polyacrylate resin, epoxy resin, phenolic resin, polyamide resin, polyimide resin, unsaturated polyester resin, polyphenylene ether resin, polyphenylene sulfide resin, and benzocyclobutene resin. In addition, the second interlayer insulating layer IL2 may have a multi-layer structure including at least one inorganic insulating layer and at least one organic insulating layer.

First conductive patterns may be provided on the second interlayer insulating layer IL2. The first conductive patterns may include the first sub-data line Dja from among the jth data lines Dja and Djb, the connection line CNL, the first auxiliary connection line AUX1, the first bridge pattern BRP1, and a first conductive layer of the power line PL.

The first sub-data line Dja may be connected to the second source electrode SE2 through the sixth contact hole CH6 passing through the gate insulating layer GI, the first interlayer insulating layer IL1, and the second interlayer insulating layer IL2.

One end of the connection line CNL may be connected to the first gate electrode GE1 through the first contact hole CH1 passing through the first interlayer insulating layer IL1 and the second interlayer insulating layer IL2. In addition, the other end of the connection line CNL may be connected to the third drain electrode DE3 and the fourth drain electrode DE4 through the second contact hole CH2 passing through the gate insulating layer GI, the first interlayer insulating layer IL1, and the second interlayer insulating layer IL2.

The first auxiliary connection line AUX1 may be connected to the initialization power line IPL through the eighth contact hole CH8 passing through the second interlayer insulating layer IL2. Also, the first auxiliary connection line AUX1 may be connected to the fourth source electrode SE4 and the seventh drain electrode DE7 through the ninth contact hole CH9 passing through the gate insulating layer GI, the first interlayer insulating layer IL1, and the second interlayer insulating layer IL2.

The first bridge pattern BRP1 may be a pattern provided as a medium for connecting the sixth drain electrode DE6 to the first electrode AD, between the sixth drain electrode DE6 and the first electrode AD. The first bridge pattern BRP1 may be connected to the sixth drain electrode DE6 through the seventh contact hole CH7 passing through the gate insulating layer GI, the first interlayer insulating layer IL1, and the second interlayer insulating layer IL2.

The first conductive layer may include a first power supply line PL1. The first power supply line PL1 may extend in one direction, and a portion of the first power supply line PL1 may have a bent shape. The first power supply line PL1 may be connected to the fifth source electrode SE5 through the fifth contact hole CH5 passing through the gate insulating layer GI, the first interlayer insulating layer IL1, and the second interlayer insulating layer IL2. Also, the first power supply line PL1 may be connected to the upper electrode UE through a third contact hole CH3 passing through the second interlayer insulating layer IL2.

A third interlayer insulating layer IL3 may be provided on the substrate SUB on which the first conductive patterns are provided. The third interlayer insulating layer IL3 may include a first insulating layer IL31 provided on the substrate SUB on which the first conductive patterns are provided, and a second insulating layer IL32 provided on the first insulating layer IL31. For example, the first insulating layer IL31 may include at least one of polysiloxane, silicon oxide, silicon nitride, and silicon oxynitride. The second insulating layer IL32 may include an organic insulating material. For example, the second insulating layer IL32 may include at least one of photoresist, polyacrylate resin, epoxy resin, phenolic resin, polyamide resin, polyimide resin, unsaturated polyester resin, polyphenylene ether resin, polyphenylene sulfide resin, and benzocyclobutene resin.

Second conductive patterns may be provided on the third interlayer insulating layer IL3. The second conductive patterns may include the second sub-data line Djb from among the jth data lines Dja and Djb, a second conductive layer of the power line PL, and the second bridge pattern BRP2. The second bridge pattern BRP2 may be connected to the first bridge pattern BRP1 through the tenth contact hole CH10 passing through the first insulating layer IL31 and the second insulating layer IL32.

The second conductive layer may include a second power supply line PL2. A portion of the second power supply line PL2 may overlap with the first power supply line PL1. The second power supply line PL2 may be connected to the first power supply line PL1 through an eleventh contact hole CH11 passing through the first insulating layer IL31 and the second insulating layer IL32. Therefore, the power line PL may include the first power supply line PL1 and the second power supply line PL2. In the power line PL, the first power supply line PL1 and the second power supply line PL2 are electrically connected to each other, and thus, it is possible to prevent or reduce a voltage drop of power supplied through the power line PL, e.g., the first power source ELVDD.

A fourth interlayer insulating layer IL4 may be provided on the third interlayer insulating layer IL3 on which the second conductive patterns are provided.

The fourth interlayer insulating layer IL4 may include an organic insulating material. For example, the fourth interlayer insulating layer IL4 may include at least one of photoresist, polyacrylate resin, epoxy resin, phenolic resin, polyamide resin, polyimide resin, unsaturated polyester resin, polyphenylene ether resin, polyphenylene sulfide resin, and benzocyclobutene resin.

The display element OLED may be provided on the fourth interlayer insulating layer IL4. The display element OLED may include the first electrode AD, the second electrode CD, and the emitting layer EML provided between the first electrode AD and the second electrode CD.

The first electrode AD may be provided on the fourth interlayer insulating layer IL4. The first electrode AD may be connected to the second bridge pattern BRP2 through the twelfth contact hole CH12 passing through the fourth interlayer insulating layer IL4. Therefore, the first electrode AD may be electrically connected to the first bridge pattern BRP1. Since the first bridge pattern BRP1 is connected to the sixth drain electrode DE6 through the seventh contact hole CH7, the first electrode AD may be electrically connected to the sixth drain electrode DE6.

A pixel defining layer PDL for defining a light emitting region to correspond to each pixel PXL may be provided on the substrate SUB on which the first electrode AD and the like are formed. The pixel defining layer PDL may expose a top surface of the first electrode AD therethrough, and may protrude from the substrate SUB along the circumference of the pixel PXL.

The emitting layer EML may be provided in the light emitting region surrounded by the pixel defining layer PDL, and the second electrode CD may be provided on the emitting layer EML. An encapsulation layer SLM for covering the second electrode CD may be provided on the second electrode CD.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

In addition, at least one of the first electrode AD and the second electrode CD may be a transmissive electrode. For example, when the display element OLED is a bottom-emission organic light emitting diode, the first electrode AD may be a transmissive electrode, and the second electrode CD may be a reflective electrode. When the display element OLED is a top-emission organic light emitting diode, the first electrode AD may be a reflective electrode, and the second electrode CD may be a transmissive electrode. When the display element OLED is a dual-emission organic light emitting diode, both of the first electrode AD and the second electrode CD may be transmissive electrodes. In the figures, a case where the display element OLED is a top-emission organic light emitting diode, and the first electrode AD is an anode electrode is described as an example.

The first electrode AD may include a reflective layer for reflecting light, and a transparent conductive layer disposed on the top surface or bottom surface of the reflective layer. At least one of the transparent conductive layer and the reflective layer may be electrically connected to the sixth drain electrode DE6.

The reflective layer may include a material capable of reflecting light. For example, the reflective layer may include at least one selected from the group consisting of aluminum (Al), silver (Ag), chromium (Cr), molybdenum (Mo), platinum (Pt), nickel (Ni), and any suitable alloy thereof.

The transparent conductive layer may include a transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be disposed on the exposed surface of the first electrode AD. The emitting layer EML may have a multi-layered thin film structure including at least a light generation layer (LGL). For example, the emitting layer EML may include a hole injection layer (HIL), a hole transport layer (HTL), the light generation layer (LGL), a hole blocking layer (HBL), an electron transport layer (ETL), and/or an electron injection layer (EIL). The hole injection layer (HIL) may inject holes. The hole transport layer (HTL) may have an excellent hole transporting property, and may increase the opportunity for holes and electrons to be re-combined by suppressing the movement of electrons that fail to be combined in the light generation layer (LGL). The light generation layer (LGL) may emit light through the re-combination of the injected electrons and holes. The hole blocking layer (HBL) may suppress the movement of holes that fail to be combined in the light generation layer (LGL). The electron transport layer (ETL) may smoothly transport electrons to the light generation layer (LGL). The electron injection layer (EIL) may inject electrons. In the emitting layer EML, the HIL, HTL, HBL, ETL, and/or EIL may be common layers that are commonly disposed in the first to fourth pixels PXL1 to PXL4, which are adjacent to one another.

The second electrode CD may be a semi-transmissive reflective layer. For example, the second electrode CD may be a thin metal layer having a thickness, through which light emitted through the emitting layer EML may be transmitted. The second electrode CD may transmit a portion of the light emitted from the emitting layer EML therethrough, and may reflect the rest of the light emitted from the emitting layer EML.

The second electrode CD may include a material having a lower work function than that of the transparent conductive layer. For example, the second electrode CD may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and any suitable alloys thereof.

A portion of the light emitted from the emitting layer EML may not be transmitted through the second electrode CD, and the light reflected from the second electrode CD may again be reflected from the reflective layer. That is, the light emitted from the emitting layer EML may resonate between the reflective layer and the second electrode CD. The light extraction efficiency of the display element OLED may be improved by the resonance of the light.

The distance between the reflective layer and the second electrode CD may be changed depending on a color of the light emitted from the emitting layer EML. That is, the distance between the reflective layer and the second electrode CD may be adjusted to correspond to a resonance distance, depending on a color of the light emitted from the emitting layer EML.

The encapsulation layer SLM may prevent or substantially prevent oxygen and moisture from infiltrating into the display element OLED. The encapsulation layer SLM may include a plurality of inorganic layers and a plurality of organic layers. For example, the encapsulation layer SLM may include a plurality of unit encapsulation layers including the inorganic layer and the organic layer disposed on the inorganic layer. In addition, the inorganic layer may be disposed at the uppermost portion of the encapsulation layer SLM. The inorganic layer may include at least one selected from the group consisting of silicon oxide, silicon nitride, silicon oxynitride, aluminum oxide, titanium oxide, zirconium oxide, and tin oxide.

The second pixel PXL2, the third pixel PXL3, and the fourth pixel PXL4 may have a stack structure similar to or substantially the same as that of the first pixel PXL1, except for data lines, scan lines, and emission control lines, which are connected thereto.

The second pixel PXL2 may be connected to the second sub-data line Djb from among the jth data lines Dja and Djb, the (k+1)th scan line Sk+1, and the (k+1)th emission control line Ek+1. The second sub-data line Djb from among the jth data lines Dja and Djb may be provided on the third interlayer insulating layer IL3. The second auxiliary connection line AUX2 may be provided between the second sub-data line Djb from among the jth data lines Dja and Djb and the second source electrode SE2. The second auxiliary connection line AUX2 may be provided on the second interlayer insulating layer IL2, and may include the same or substantially the same material as that of the first auxiliary connection line AUX1. One end of the second auxiliary connection line AUX2 may be connected to the second source electrode SE2 through the sixth contact hole CH6, and the other end of the second auxiliary connection line AUX2 may be connected to the data lines Djb and Dj+1a through the fourth contact hole CH4.

The third pixel PXL3 may be connected to the second sub-data line Dj+1b from among the (j+1)th data lines Dj+1a and Dj+1b provided on the same layer as that of the first sub-data line Dja from among the jth data lines Dja and Djb, the kth scan line Sk, and the kth emission control line Ek.

The fourth pixel PXL4 may be connected to the first sub-data line Dj+1a from among the (j+1)th data lines Dj+1a and Dj+1b, the (k+1)th scan line Sk+1, and the (k+1)th emission control line Ek+1. The first sub-data line Dj+1a from among the (j+1)th data lines Dj+1a and Dj+1b may be provided on the third interlayer insulating layer IL3. The second auxiliary connection line AUX2 may be provided between the first sub-data line Dj+1a from among the (j+1)th data lines Dj+1a and Dj+1b and the second source electrode SE2. The second auxiliary connection line AUX2 may be provided on the second interlayer insulating layer IL2, and may include the same or substantially the same material as that of the first auxiliary connection line AUX1. One end of the second auxiliary connection line AUX2 may be connected to the second source electrode SE2 through the sixth contact hole CH6, and the other end of the second auxiliary connection line AUX2 may be connected to the data lines Djb and Dj+1a through the fourth contact hole CH4.

Figure 10:
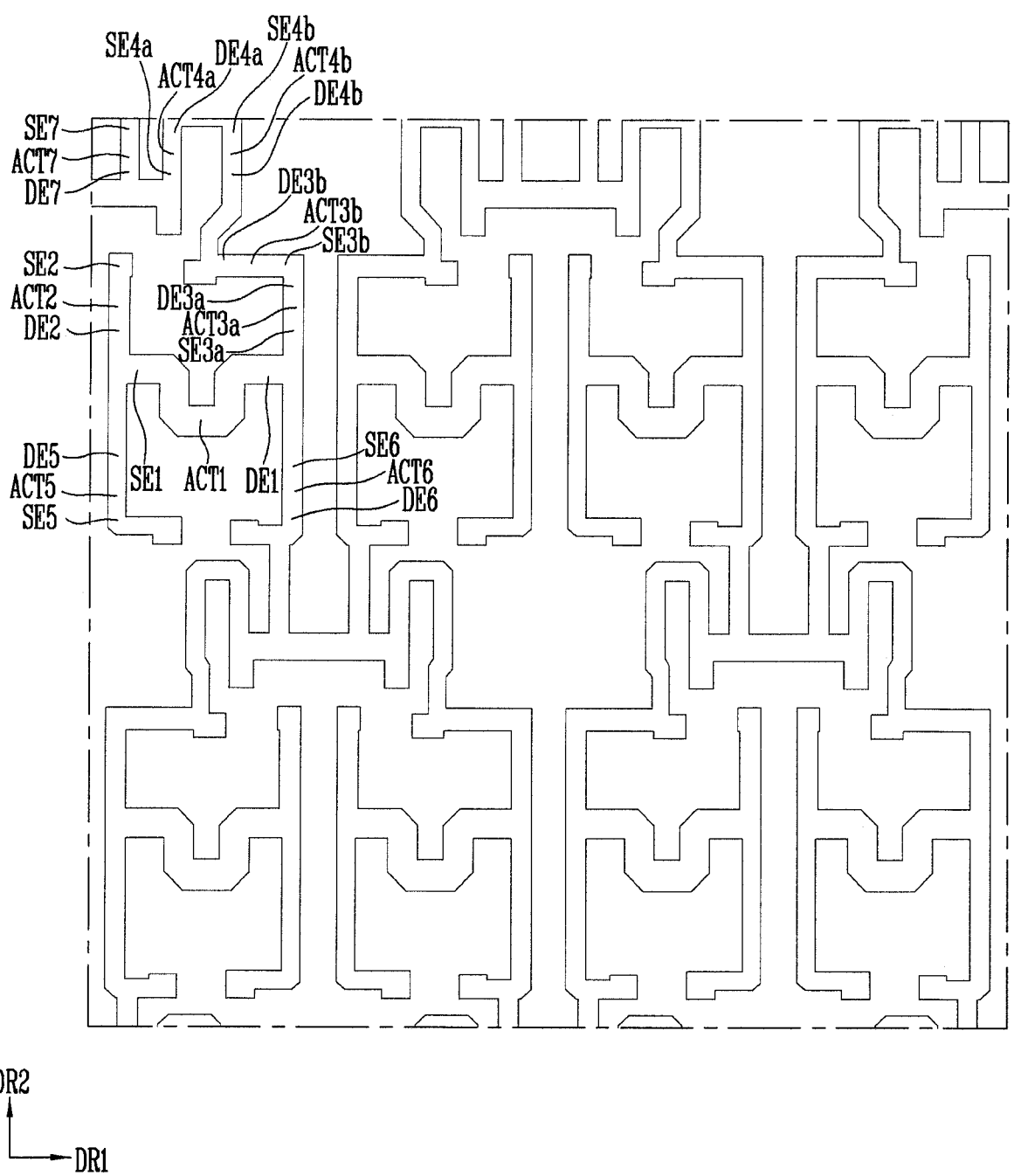
FIG. 10 is a plan view illustrating active patterns, source electrodes, and drain electrodes, shown in FIGS. 4 to 9.
Figure 11:
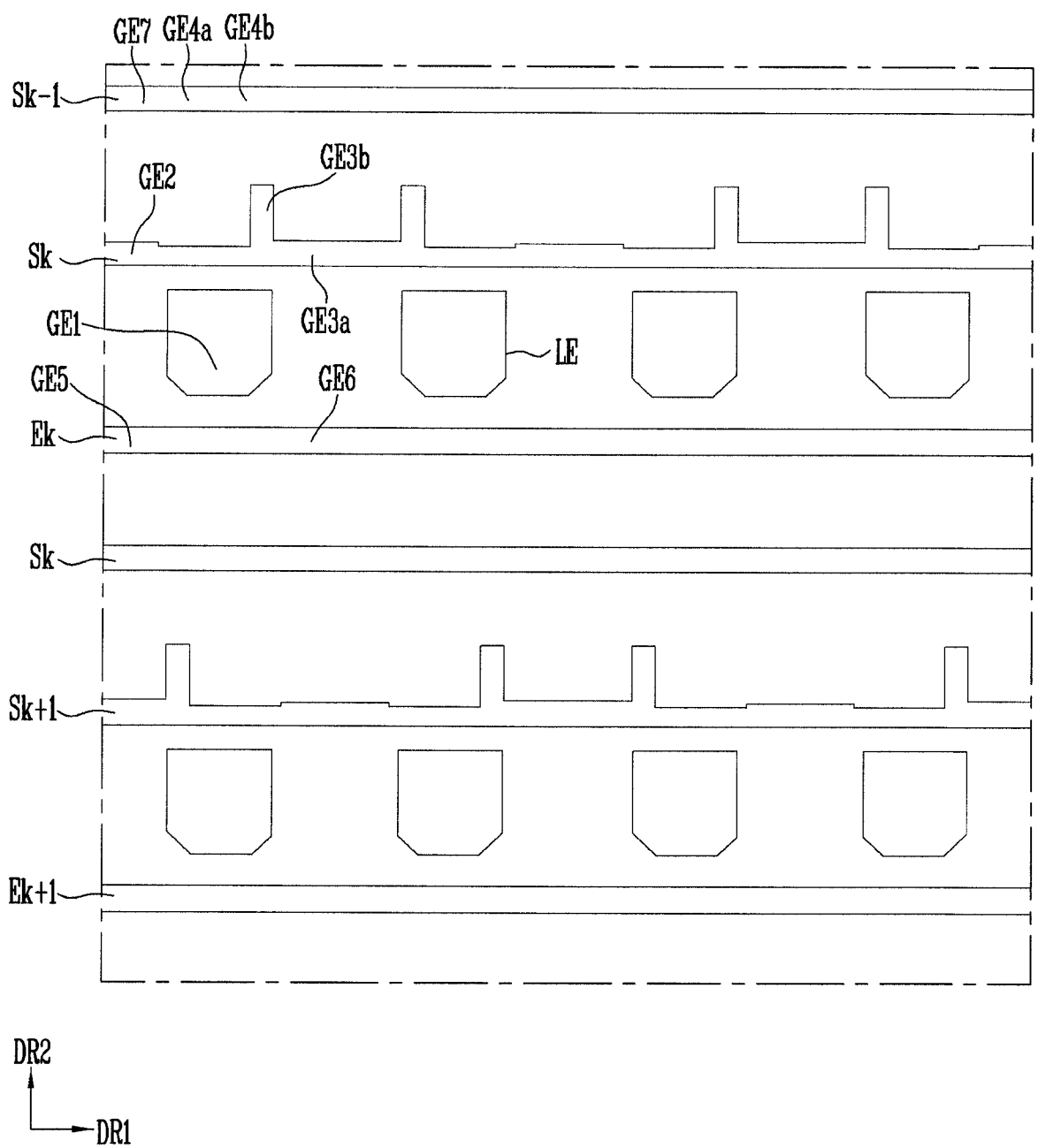
FIG. 11 is a plan view illustrating scan lines, emission control lines, and a lower electrode of a storage capacitor, shown in FIGS. 4 to 9.
Figure 12:
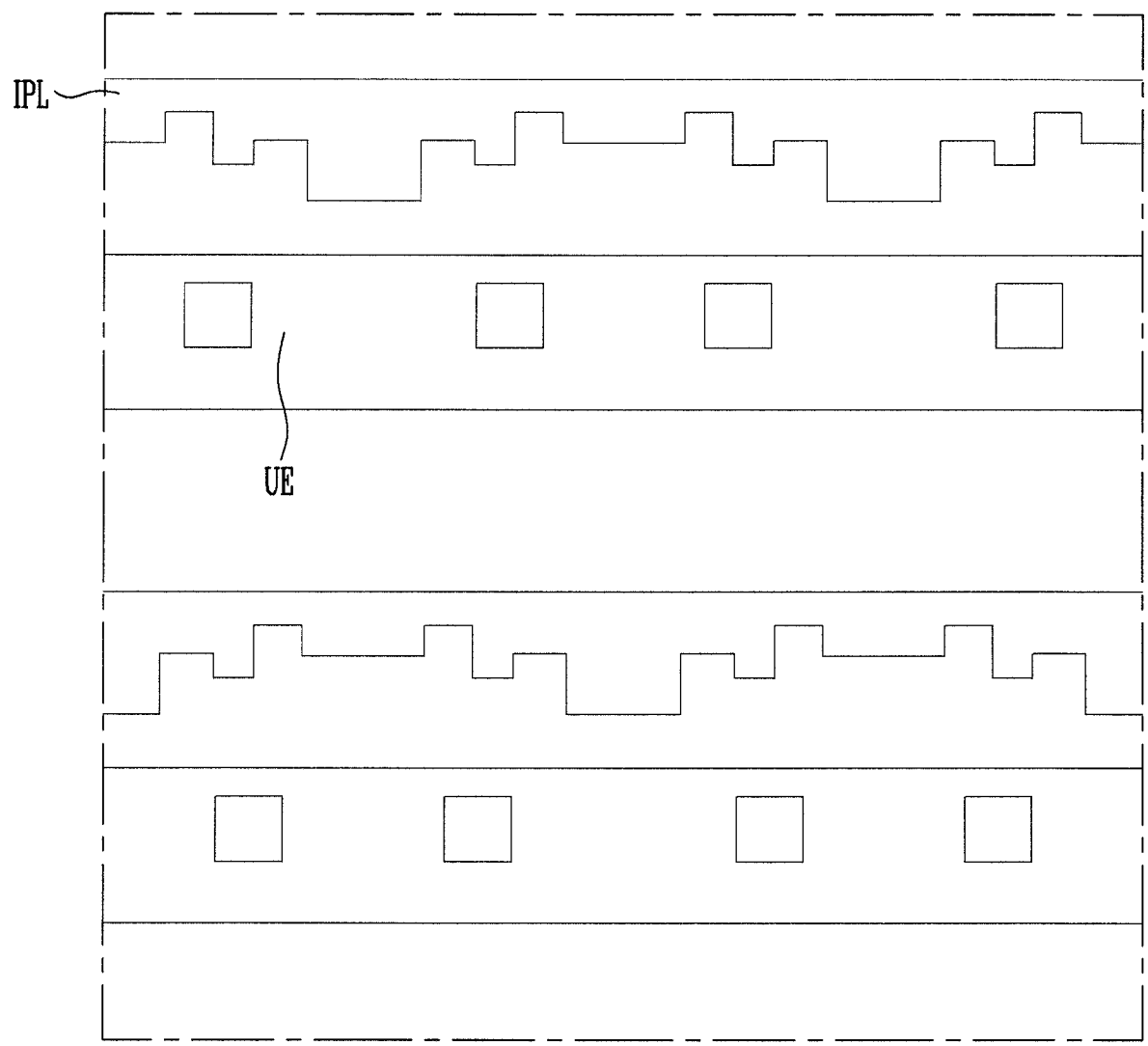
FIG. 12 is a plan view illustrating an initialization power line and an upper electrode of the storage capacitor, shown in FIGS. 4 to 9.
Figure 13:
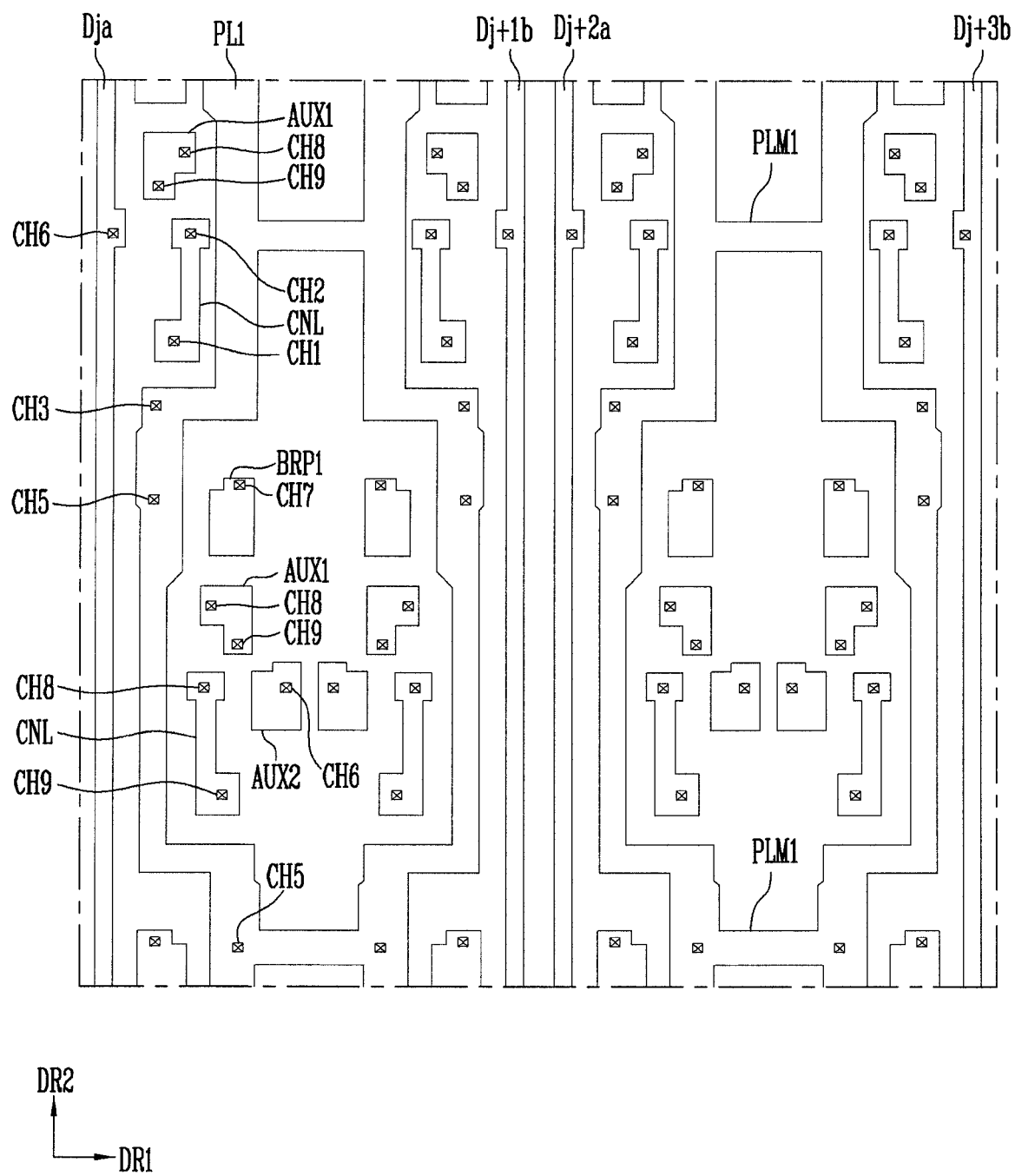
FIG. 13 is a plan view illustrating data lines, a connection line, an auxiliary connection line, a first conductive layer of the power line, and a first bridge pattern, shown in FIGS. 4 to 9.
Figure 14:
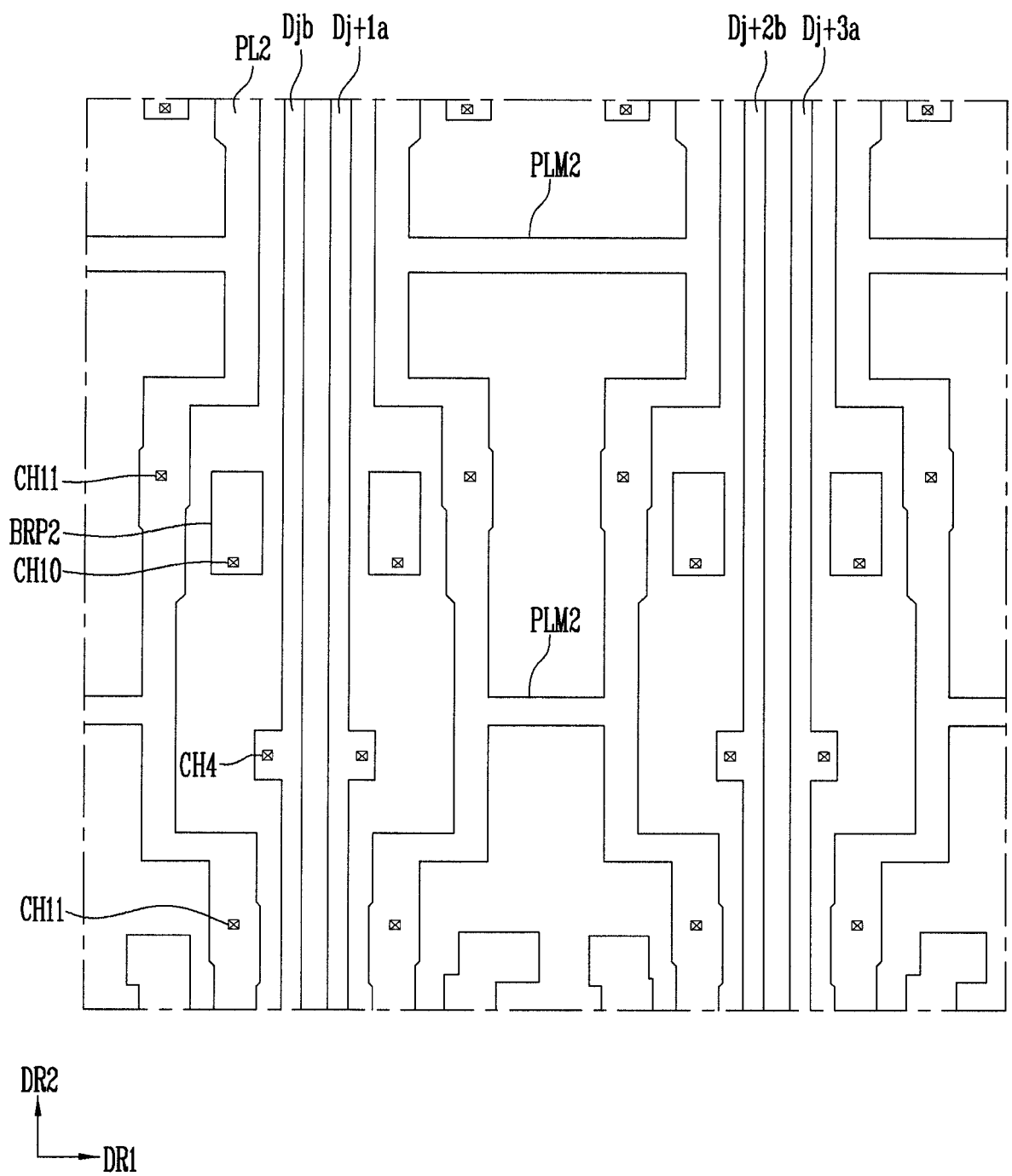
FIG. 14 is a plan view illustrating data lines, a second conductive layer of the power line, and a second bridge pattern, shown in FIGS. 4 to 9.
Figure 15:
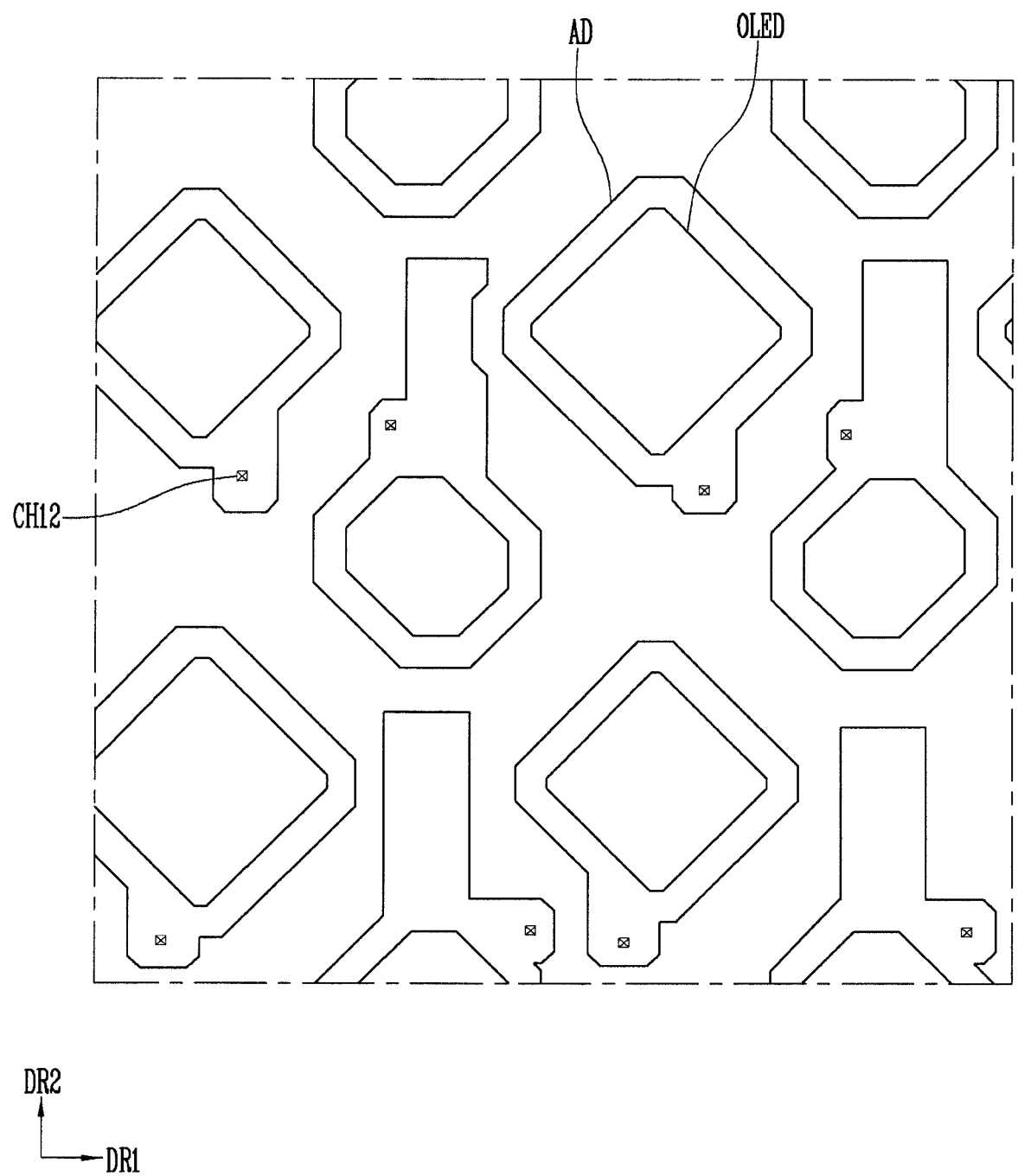
FIG. 15 is a plan view illustrating an organic light emitting diode shown in FIGS. 4 to 9.

FIG. 10 is a plan view illustrating the active patterns, the source electrodes, and the drain electrodes, shown in FIGS. 4 to 9. FIG. 11 is a plan view illustrating the scan lines, the emission control lines, and the lower electrode of the storage capacitor, shown in FIGS. 4 to 9. FIG. 12 is a plan view illustrating the initialization power line and the upper electrode of the storage capacitor, shown in FIGS. 4 to 9. FIG. 13 is a plan view illustrating the data lines, the connection line, the auxiliary connection line, the first conductive layer of the power line, and the first bridge pattern, shown in FIGS. 4 to 9. FIG. 14 is a plan view illustrating the data lines, the second conductive layer of the power line, and the second bridge pattern, shown in FIGS. 4 to 9. FIG. 15 is a plan view illustrating the organic light emitting diode shown in FIGS. 4 to 9. In FIGS. 10 to 15, for convenience of illustration, components of pixels on the kth pixel row, the (k+1)th pixel row, the jth pixel column, the (j+1)th pixel column, the (j+2)th pixel column, and the (j+3)th pixel column are illustrated for each layer.

Referring to FIGS. 2 to 15, the first to seventh active patterns ACT1 to ACT7, the first to seventh source electrodes SE1 to SE7, and the first to seventh drain electrodes DE1 to DE7 may be provided on the substrate SUB. The first to seventh active patterns ACT1 to ACT7, the first to seventh source electrodes SE1 to SE7, and the first to seventh drain electrodes DE1 to DE7 may include the same or substantially the same material, and may be formed through the same or substantially the same process. The first to seventh source electrodes SE1 to SE7, and the first to seventh drain electrodes DE1 to DE7 may include a semiconductor material.

One end of the first active pattern ACT1 may be connected to the first source electrode SE1, and the other end of the first active pattern ACT1 may be connected to the first drain electrode DE1. One end of the second active pattern ACT2 may be connected to the second source electrode SE2, and the other end of the second active pattern ACT2 may be connected to the second drain electrode DE2. One end of the third active pattern ACT3 may be connected to the third source electrode SE3, and the other end of the third active pattern ACT3 may be connected to the third drain electrode DE3. One end of the fourth active pattern ACT4 may be connected to the fourth source electrode SE4, and the other end of the fourth active pattern ACT4 may be connected to the fourth drain electrode DE4. One end of the fifth active pattern ACT5 may be connected to the fifth source electrode SE5, and the other end of the fifth active pattern ACT5 may be connected to the fifth drain electrode DE5. One end of the sixth active pattern ACT6 may be connected to the sixth source electrode SE6, and the other end of the sixth active pattern ACT6 may be connected to the sixth drain electrode DE5. One end of the seventh active pattern ACT7 may be connected to the seventh source electrode SE7, and the other end of the seventh active pattern ACT7 may be connected to the seventh drain electrode DE7.

The (k−1)th scan line Sk−1, the kth scan line Sk, the (k+1)th scan line Sk+1, the kth emission control line Ek, the (k+1)th emission control line Ek+1, and the first to seventh gate electrodes GE1 to GE7 may be provided on the gate insulating layer GI provided on the first to seventh active patterns ACT1 to ACT7. The (k−1)th scan line Sk−1, the kth scan line Sk, the (k+1)th scan line, the kth emission control line Ek, the (k+1)th emission control line Ek+1, and the first to seventh gate electrodes GE1 to GE7 may include the same or substantially the same material, and may be formed through the same or substantially the same process.

On the kth pixel row, the (k−1)th scan line Sk−1, the kth scan line Sk, the kth emission control line Ek, and the first to seventh gate electrodes GE1 to GE7 may be provided on the gate insulating layer GI. The first gate electrode GE1 may be the lower electrode LE of the storage capacitor Cst. The second gate electrode GE2 and the third gate electrode GE3 may be integrally formed with the kth scan line Sk. The fourth gate electrode GE4 and the seventh gate electrodes GE7 may be integrally formed with the (k−1)th scan line Sk−1. The fifth gate electrode GE5 and the sixth gate electrode GE6 may be integrally formed with the kth emission control line Ek.

On the (k+1)th pixel row, the kth scan line Sk, the (k+1)th scan line Sk+1, the (k+1)th emission control line Ek+1, and the first to seventh gate electrodes GE1 to GE7 may be provided on the gate insulating layer GI. The second gate electrode GE2 and the third gate electrode GE3 may be integrally formed with the (k+1)th scan line Sk+1. The fourth gate electrode GE4 and the seventh gate electrode GE7 may be integrally formed with the kth scan line Sk. The fifth gate electrode GE5 and the sixth gate electrode GE6 may be integrally formed with the (k+1)th emission control line Ek+1.

The upper electrode UE of the storage capacitor Cst and the initialization power line IPL may be provided on the first interlayer insulating layer IL1 provided on the (k−1)th scan line Sk−1, the kth scan line Sk, the (k+1)th scan line Sk+1, the kth emission control line Ek, the (k+1)th emission control line Ek+1, and the first to seventh gate electrodes GE1 to GE7. The initialization power line IPL and the upper electrode UE may include the same or substantially the same material, and be formed through the same or substantially the same process.

The first data pattern, the connection line CNL, the first auxiliary connection line AUX1, the second auxiliary connection line AUX2, the first bridge pattern BRP1, and the first conductive layer of the power line PL may be provided on the second interlayer insulating layer IL2 provided on the initialization power line IPL and the upper electrode UE. The first data pattern, the first auxiliary connection line AUX1, the second auxiliary connection line AUX2, the first bridge pattern BRP1, and the first conductive layer of the power line PL may include the same or substantially the same material, and be formed through the same or substantially the same process.

The first data pattern may include a plurality of data lines Dja, Dj+1b, Dj+2a, and Dj+3b. On the kth pixel row, the data lines Dja, Dj+1b, Dj+2a, and Dj+3b may be connected to the second source electrode SE2 through the sixth contact hole CH6 passing through the gate insulating layer GI, the first interlayer insulating layer IL1, and the second interlayer insulating layer IL2. In addition, the data lines Dja, Dj+1b, Dj+2a, and Dj+3b provided on the second interlayer insulating layer IL2 may be disposed between pixel columns that are adjacent to each other.

The first conductive layer may include a plurality of first power supply lines PL1. The first power supply lines PL1 may extend in parallel to at least one of the data lines Dja, Dj+1b, Dj+2a, and Dj+3b and the scan lines Sk−1, Sk, and Sk+1, e.g., the data lines Dja, Dj+1b, Dj+2a, and Dj+3b. The first power supply lines PL1 may be connected to the upper electrode UE through the third contact hole CH3 passing through the second interlayer insulating layer IL2. Also, the first power supply lines PL1 may be connected to the fifth source electrodes SE5 through the fifth contact hole CH5 passing through the gate insulating layer GI, the first interlayer insulating layer IL1, and the second interlayer insulating layer IL2.

First power supply lines PL1 that are adjacent to each other, e.g., first power supply lines PL1 on pixel columns adjacent to each other, may be connected through first power connection lines PLM1. The first power connection lines PLM1 may cross the data lines Dja, Dj+1b, Dj+2a, and Dj+3b provided on the third interlayer insulating layer IL3. Therefore, the first power supply lines PL1 that are adjacent to each other may be electrically connected to the first power connection lines PLM1. The first power connection lines PLM1 may be provided on the same layer as that of the first power supply lines PL1. Here, the term "to be provided on the same layer" may mean to include the same or substantially the same material and to be formed through the same or substantially the same process. For example, like the first power supply lines PL1, the first power connection lines PLM1 may be provided on the second interlayer insulating layer IL2. Also, the first power connection lines PLM1 may include the same or substantially the same material as that of the first power supply lines PL1, and may be formed through the same or substantially the same process.

The connection line CNL may be connected to the first gate electrode GE through the first contact hole CH1 passing through the first interlayer insulating layer IL1 and the second interlayer insulating layer IL2. Also, the connection line CNL may be connected to the third drain electrode DE3 and the fourth drain electrode DE4 through the second contact hole CH2 passing through the gate insulating layer GI, the first interlayer insulating layer IL1, and the second interlayer insulating layer IL2.

The first auxiliary connection line AUX1 may be connected to the initialization power line ILP through the eighth contact hole CH8 passing through the second interlayer insulating layer IL2. Also, the first auxiliary connection line AUX1 may be connected to the seventh drain electrode DE7 through the ninth contact hole CH9 passing through the gate insulating layer GI, the first interlayer insulating layer IL1, and the second interlayer insulating layer IL2.

The second auxiliary connection line AUX2 may be connected to the second source electrode SE2 through the sixth contact hole CH6, and may be connected to the data lines Dja, Dj+1b, Dj+2a, and Dj+3b through the fourth contact hole CH4.

The first bridge pattern BRP1 may be connected to the sixth drain electrode DE6 through the seventh contact hole CH7 passing through the gate insulating layer GI, the first interlayer insulating layer IL1, and the second interlayer insulating layer IL2.

A second data pattern, the second conductive layer of the power line PL, and the second bridge pattern BRP2 may be provided on the first data pattern, the connection line CNL, the first auxiliary connection line AUX1, the second auxiliary connection line AUX2, the first bridge pattern BRP1, and the third interlayer insulating layer IL3 on the first conductive layer of the power line PL. The second data pattern, the second conductive layer of the power line PL, and the second bridge pattern BRP2 may include the same or substantially the same material, and may be formed through the same or substantially the same process.

The second data pattern may include a plurality of data lines Djb, Dj+1a, Dj+2b, and Dj+3a. That is, the data lines Dja, Dj+1b, Dj+2a, and Dj+3b included in the first data pattern and the data lines Djb, Dj+1a, Dj+2b, and Dj+3a included in the second data pattern may be provided on layers that are different from each other. On the (k+1)th pixel row, the data lines Djb, Dj+1a, Dj+2b, and Dj+3a may be connected to the second source electrode SE2 through the second auxiliary connection line AUX2. One end of the second auxiliary connection line AUX2 may be connected to the second source electrode SE2 through the sixth contact hole CH6 passing through the gate insulating layer GI, the first interlayer insulating layer IL1, and the second interlayer insulating layer IL2. The other end of the second auxiliary connection line AUX2 may be connected to the data lines Djb, Dj+1a, Dj+2b, and Dj+3a through the fourth contact hole CH4 passing through the third interlayer insulating layer IL3. In addition, the data lines Djb, Dj+1a, Dj+2b, and Dj+3a provided on the third interlayer insulating layer IL3 may be disposed between pixel columns that are adjacent to each other.

Two data lines Djb and Dj+1a that are adjacent to each other from among the four data lines Dja, Djb, Dj+1a, and Dj+1b, and connected to two pixel columns that are adjacent to each other, e.g., the jth pixel column and the (j+1)th pixel column, respectively, may be connected to pixels located on the same pixel column. In addition, two data lines Dja and Dj+1b located most distant from each other from among the four data lines Dja, Djb, Dj+1a, and Dj+1b, and connected to the two pixel columns that are adjacent to each other, respectively, may be connected to the same pixel row. Here, the two data lines Djb and Dj+1a that are adjacent to each other may be provided on the same layer, e.g., the third interlayer insulating layer IL3. In addition, the two data lines Dja and Dj+1b located most distant from each other may be provided on the same layer, e.g., the second interlayer insulating layer IL2. That is, the two data lines Djb and Dj+1a that are adjacent to each other and the two data lines Dja and Dj+1b located most distant from each other may be provided on layers that are different from each other.

As described above, if the second data pattern is provided on the third interlayer insulating layer IL3, the distance of the data lines Djb, Dj+1a, Dj+2b, and Dj+3a provided on the third interlayer insulating layer IL3 from respective ones of the first transistors T1 may be increased. Therefore, the parasitic capacitance of a parasitic capacitor formed between the data lines Djb, Dj+1a, Dj+2b, and Dj+3a and the first gate electrode GE1 of the first transistors T1 may be decreased. Due to the parasitic capacitance of the parasitic capacitor, a crosstalk may be generated between the data lines Djb, Dj+1a, Dj+2b, and Dj+3a and the first transistors T1. Therefore, if the parasitic capacitance is decreased, the crosstalk between the data lines Djb, Dj+1a, Dj+2b, and Dj+3a and the first transistors T1 may be reduced.

The second bridge pattern BRP2 may be connected to the first bridge pattern BRP1 through the tenth contact hole CH10 passing through the third interlayer insulating layer IL3.

The second conductive layer may include a plurality of second power supply lines PL2. At least some of the second power supply lines PL2 may overlap with the first power supply lines PL1.

The second power supply lines PL2 may extend in parallel with at least one of the data lines Djb, Dj+1a, Dj+2b, and Dj+3a of the second data pattern and the scan lines Sk−1, Sk, and Sk+1, e.g., the data lines Djb, Dj+1a, Dj+2b, and Dj+3a of the second data pattern. The second power supply lines PL2 may be connected to the first power supply lines PL1 through the eleventh contact hole CH11 passing through the third interlayer insulating layer IL3. For example, the eleventh contact hole CH11 may be disposed in a region in which the first power supply lines PL1 and the second power supply lines PL2 overlap with each other, and the first power supply lines PL1 and the second power supply lines PL2 may be electrically connected to each other through the eleventh contact hole CH11.

Second power supply lines PL2 that are adjacent to each other, e.g., second power supply lines PL2 on pixel columns adjacent to each other, may be connected to each other through the second power connection lines PLM2. The second power connection lines PLM2 may cross the data lines Dja, Dj+1b, Dj+2a, and Dj+3b provided on the second interlayer insulating layer IL2. Therefore, the second power supply lines PL2 that are adjacent to each other may be electrically connected to each other through the second power connection lines PLM2. The second power connection lines PLM2 may be provided on the same layer as that of the second power supply lines PL2. Here, the term "to be provided on the same layer" may mean to include the same or substantially the same material and to be formed through the same or substantially the same process. For example, like the second power supply lines PL2, the second power connection lines PLM2 may be provided on the third interlayer insulating layer IL3. Also, the second power connection lines PLM2 may include the same or substantially the same material as that of the second power supply lines PL2, and may be formed through the same or substantially the same process. The second power connection lines PLM2 may be provided to be spaced apart from the first power connection lines PLM1.

As described above, the first power supply lines PL1 and the second power supply lines PL2 may be provided on layers that are different from each other, and may be connected to each other through the eleventh contact hole CH11. For example, the first power supply lines PL1 may be provided on the second interlayer insulating layer IL2, and first power supply lines PL1 that are adjacent to each other may be connected to each other through the first power connection lines PLM1. The second power supply lines PL2 may be provided on the third interlayer insulating layer IL3, and second power supply lines PL2 that are adjacent to each other may be connected to each other through the second power connection lines PLM2. In addition, the first power supply lines PL1 and the second power supply lines PL2 may be electrically connected to each other through the eleventh contact hole CH11. Thus, the power line PL including the first power supply lines PL1 and the second power supply lines PL2 is connected in a mesh form, to prevent or reduce a voltage drop of the first power source ELVDD. If the voltage drop of the first power source ELVDD is prevented or reduced, the first power source ELVDD may be uniformly supplied to the pixels PXL1, PXL2, PXL3, and PXL4, and the quality of the display device can be prevented or substantially prevented from being deteriorated.

The display element OLED may be provided on the fourth interlayer insulating layer IL4 provided on the second data pattern, the second conductive layer, and the second bridge pattern BRP2. Each of the display elements OLEDs may include the first electrode AD on the fourth interlayer insulating layer IL4, the emitting layer EML on the first electrode AD, and the second electrode CD on the emitting layer EML.

The first electrode AD may be connected to the second bridge pattern BRP2 through the second contact hole CH12 passing through the fourth interlayer insulating layer IL4.

As described above, according to one or more embodiments of the present disclosure, the display quality of the display device may be improved by preventing or reducing a crosstalk. Further, as the power line has a mesh structure, a voltage drop is prevented or reduced, so that the display quality of the display device may be improved.

Example embodiments have been disclosed herein, and although specific terms are employed, they are used and are to be interpreted in a generic and descriptive sense only and not for purpose of limitation. In some examples, as would be apparent to one of ordinary skill in the art, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and details may be made, all without departing from the spirit and scope of the present disclosure as set forth in the following claims, and their equivalents.

What is claimed is:

1. A display device comprising:
    pixel rows including pixels arranged along a first direction, the pixel rows being repeatedly arranged along a second direction crossing the first direction; pixel columns including pixels arranged along the second direction, the pixel columns being repeatedly arranged along the first direction;
    data lines connected to respective pixel columns, each of the data lines including a first sub-data line provided at one side of a corresponding pixel column and a second sub-data line provided at another side of the corresponding pixel column;
    scan lines extending along the first direction, the scan lines being connected to respective pixel rows; and
    a power line configured to supply driving power to the pixels,
    wherein one of the pixels of the pixel columns is connected to the first sub-data line, and a pixel adjacent to the pixel connected to the first sub-data line is connected to the second sub-data line, and
    wherein the first sub-data line and the second sub-data line in the same pixel column are on different layers from each other.

2. The display device of claim 1, wherein the power line is provided between the first sub-data line and the second sub-data line.

3. The display device of claim 2, wherein each of the pixels includes:
    at least one transistor; and
    a display element connected to the transistor,
    wherein the transistor includes an active pattern provided on a substrate, source and drain electrodes each connected to the active pattern, a gate electrode provided on the active pattern with a gate insulating layer interposed therebetween, and an interlayer insulating layer including first, second, and third interlayer insulating layers covering the gate electrode, the first, second, and third interlayer insulating layers being sequentially stacked, and
    wherein the display element is connected to the drain electrode.

4. The display device of claim 3, wherein one of the first sub-data line and the second sub-data line is on the second interlayer insulating layer, and
    wherein the other of the first sub-data line and the second sub-data line is on the third interlayer insulating layer.

5. The display device of claim 4, wherein the power line includes first and second power supply lines on different layers from each other, the first and second power supply lines overlapping with each other.

6. The display device of claim 5, wherein one of the first power supply line and the second power supply line is on the second interlayer insulating layer,
    wherein the other of the first power supply line and the second power supply line is on the third interlayer insulating layer, and
    wherein the first power supply line and the second power supply line are connected to each other through a contact hole.

7. The display device of claim 6, wherein first power supply lines of pixel columns that are adjacent to each other are connected to each other through a first power connection line, and
    wherein the first power connection line is on the same layer as that of the first power supply lines.

8. The display device of claim 7, wherein the first power supply lines and the first power connection line are on the second interlayer insulating layer.

9. The display device of claim 7, wherein second power supply lines of pixel columns that are adjacent to each other are connected to each other through a second power connection line, and
    wherein the second power connection line is on the same layer as that of the second power supply line.

10. The display device of claim 9, wherein the second power supply lines and the second power connection line are on the third interlayer insulating layer.

11. The display device of claim 4, further comprising a storage capacitor including a lower electrode on the gate insulating layer and an upper electrode on the first interlayer insulating layer.

12. The display device of claim 11, further comprising a first bridge pattern on the second interlayer insulating layer, the first bridge pattern being configured to electrically connect the drain electrode and the display element to each other.

13. The display device of claim 12, further comprising a second bridge pattern on the third interlayer insulating layer, the second bridge pattern being configured to electrically connect the first bridge pattern and the display element to each other.

14. The display device of claim 13, wherein the display element includes a first electrode on a fourth interlayer insulating layer on the third interlayer insulating layer, an emitting layer on the first electrode, and a second electrode on the emitting layer, and
   wherein the first electrode is connected to the second bridge pattern through a contact hole passing through the fourth interlayer insulating layer.

15. The display device of claim 4, wherein the first sub-data line and the second sub-data line that are between two different pixel columns that are adjacent to each other are connected to the two different pixel columns, and are on the same layer.

16. The display device of claim 15, wherein two sub-data lines that are located most distant from each other from among four sub-data lines that are connected to the two pixel columns that are adjacent to each other are connected to pixels located on the same pixel row.

17. The display device of claim 16, wherein the two sub-data lines located most distant from each other are on the same layer.

18. The display device of claim 16, wherein two sub-data lines that are adjacent to each other from among the four sub-data lines that are connected to the two pixel columns that are adjacent to each other are connected to pixels located on the same pixel row.

19. The display device of claim 18, wherein the two sub-data lines that are adjacent to each other are on the same layer.

20. The display device of claim 18, wherein the two sub-data lines that are located most distant from each other and the two sub-data lines that are adjacent to each other are on different layers from each other.

21. The display device of claim 18, further comprising:
   a data driver configured to supply a data signal to the data lines through output lines; and
      demultiplexers connected between the output lines and the data lines.

22. The display device of claim 21, wherein the demultiplexers are configured to time-divisionally transmit the data signal to the first sub-data line and the second sub-data line.

23. The display device of claim 22, wherein the first sub-data line and the second sub-data line that are between the two different pixel columns that are adjacent to each other are connected to different demultiplexers from each other, and are configured to receive a data signal input during the same period.

* * * * *